United States Patent
Kojima et al.

(10) Patent No.: US 10,241,552 B2
(45) Date of Patent: Mar. 26, 2019

(54) MEMORY SYSTEM AND CONTROL METHOD

(71) Applicant: Toshiba Memory Corporation, Tokyo (JP)

(72) Inventors: Yoshihisa Kojima, Kawasaki Kanagawa (JP); Masanobu Shirakawa, Chigasaki Kanagawa (JP); Kazutaka Takizawa, Yokohama Kanagawa (JP); Hiroyuki Moro, Hachioji Tokyo (JP); Takuya Futatsuyama, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/710,381

(22) Filed: Sep. 20, 2017

(65) Prior Publication Data

US 2018/0081414 A1 Mar. 22, 2018

(30) Foreign Application Priority Data

Sep. 20, 2016 (JP) .................. 2016-183092

(51) Int. Cl.
| | |
|---|---|
| G11C 29/00 | (2006.01) |
| G06F 1/30 | (2006.01) |
| G06F 11/16 | (2006.01) |
| G06F 11/20 | (2006.01) |
| G11C 29/52 | (2006.01) |
| G11C 29/04 | (2006.01) |

(52) U.S. Cl.
CPC ............ *G06F 1/30* (2013.01); *G06F 11/1666* (2013.01); *G06F 11/2015* (2013.01); *G11C 29/52* (2013.01); *G11C 2029/0411* (2013.01)

(58) Field of Classification Search
CPC .... G06F 1/30; G06F 11/1666; G06F 11/2015; G11C 29/52
USPC ......................................... 365/229
See application file for complete search history.

(56) References Cited

U.S. PATENT DOCUMENTS

| | | | | |
|---|---|---|---|---|
| 8,891,301 | B1 * | 11/2014 | Shlick ................... | G11C 5/005 365/185.03 |
| 9,251,064 | B2 | 2/2016 | Kimmel | |
| 2006/0139844 | A1 * | 6/2006 | Kameyama .......... | G06F 7/4824 361/272 |
| 2010/0293331 | A1 * | 11/2010 | Fujii ................... | G06F 11/1441 711/119 |
| 2011/0179322 | A1 * | 7/2011 | Lee .................... | G06F 11/1048 714/719 |
| 2012/0151301 | A1 * | 6/2012 | Izumi ................. | G06F 11/1048 714/773 |

(Continued)

*Primary Examiner* — Anthan Tran
(74) *Attorney, Agent, or Firm* — Kim & Stewart LLP

(57) ABSTRACT

A memory system includes a nonvolatile memory a controller that controls the nonvolatile memory, and a backup power supply. In response to a detection that power from an external source to the memory system is interrupted, at which time power to the memory system starts to be supplied from the backup power supply, the controller transmits a first command to the nonvolatile memory to change a parameter for a write operation and then transmits a second command to the nonvolatile memory to carry out a write operation, such that the nonvolatile memory carries out the write operation using the changed parameter.

19 Claims, 27 Drawing Sheets

(56) References Cited

U.S. PATENT DOCUMENTS

2013/0205065 A1 8/2013 Kloeppner et al.
2015/0339203 A1 11/2015 Blount et al.

\* cited by examiner

MEMORY SYSTEM AND CONTROL METHOD

CROSS-REFERENCE TO RELATED APPLICATION

This application is based upon and claims the benefit of priority from Japanese Patent Application No. 2016-183092, filed Sep. 20, 2016, the entire contents of which are incorporated herein by reference.

FIELD

Embodiments described herein relate generally to a memory system and a control method.

BACKGROUND

A memory system including a semiconductor nonvolatile memory (semiconductor memory) and a memory controller that controls the semiconductor nonvolatile memory is known. The memory system operates by receiving supply of power from the outside. The memory system may include an auxiliary power supply in order to make necessary data (e.g., dirty data), which is not yet in a state of being non-volatile, non-volatile after supply of power from the outside is cut off. That is, the memory system uses the auxiliary power supply to make necessary data, which is not yet in a state of being non-volatile, non-volatile. On the other hand, a period of time is limited for the memory system to be driven by the auxiliary power supply.

DETAILED DESCRIPTION

Embodiments provide a memory system capable of efficiently writing unwritten data (including dirty data) into a non-volatile memory when supply of power from the outside is stopped.

In general, according to one embodiment, a memory system includes a nonvolatile memory, a controller that controls the nonvolatile memory, and a backup power supply. In response to a detection that power from an external source to the memory system is interrupted, at which time power to the memory system starts to be supplied from the backup power supply, the controller transmits a first command to the nonvolatile memory to change a parameter for a write operation and then transmits a second command to the nonvolatile memory to carry out a write operation, such that the nonvolatile memory carries out the write operation using the changed parameter.

When supply of power is suddenly stopped, it is possible to provide a memory system capable of efficiently writing, into the nonvolatile memory, data which is not written yet.

In the following, embodiments will be described with reference to the accompanying drawings. In the following description, elements having substantially the same function and configuration may be denoted by the same reference symbols and a repetitive description thereof may be omitted. Descriptions of a certain embodiment are applicable to other embodiments except when excluded expressly or where obvious.

Each functional block described herein may be implemented in hardware, computer software, or a combination of both hardware and computer software. In some cases, a function described herein as being executed by a particular functional block may be executed by a different functional block. In addition, a functional block may be divided into smaller functional sub-blocks.

Any of the steps in a process of a method in an embodiment may be carried out according to a sequence different from the illustrated sequence or concurrently with another step as long as it is able to be executed in such a manner.

In the specification and the claims, the term "connection" includes a direct connection and a connection through an electrically conductive element.

First Embodiment

<1.1. Configuration (Structure)>
<1.1.1. Memory System>

Figure 1:
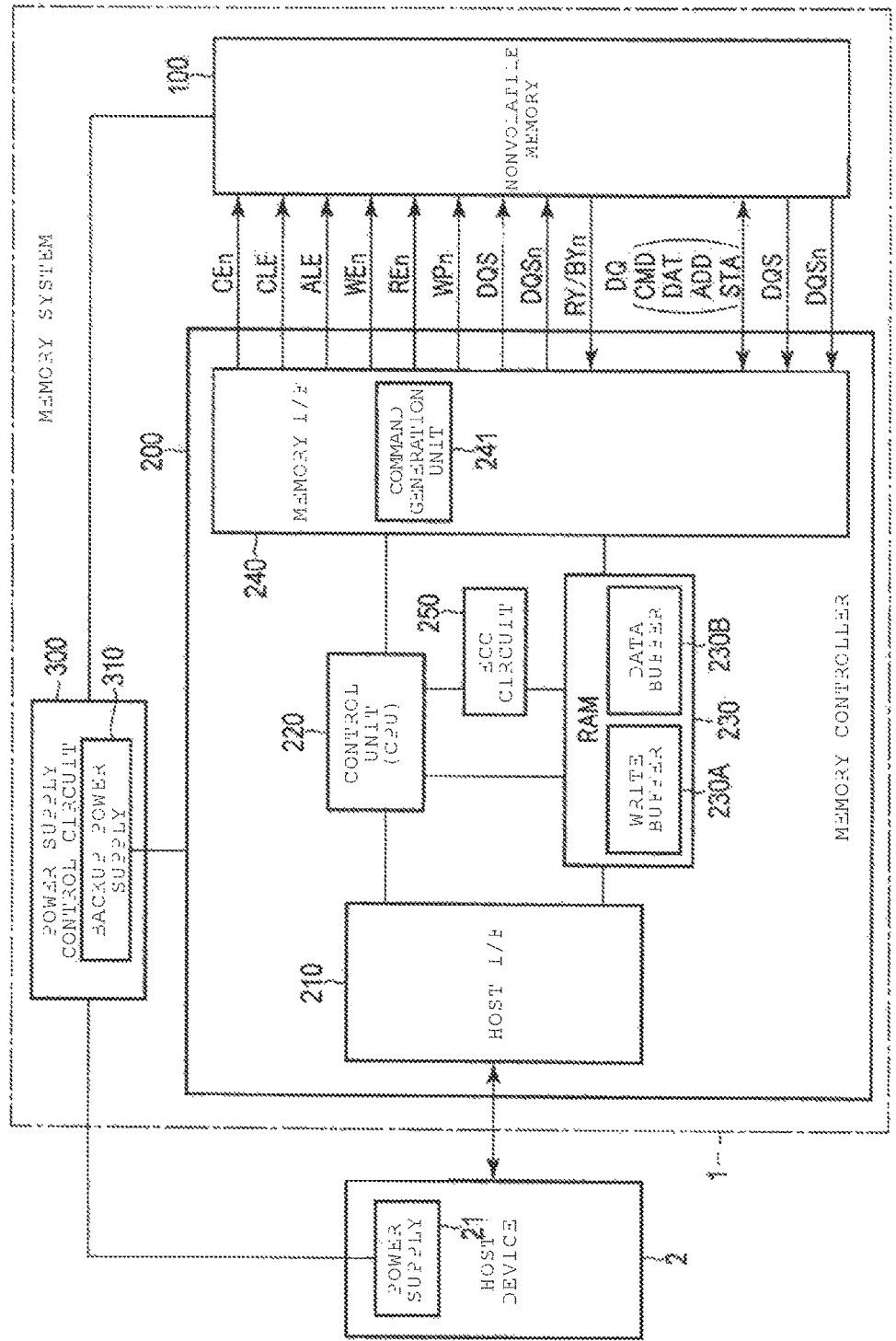
FIG. 1 is a diagram illustrating a functional block of a memory system of a first embodiment.

FIG. 1 is a diagram illustrating a functional block of a memory system 1 of a first embodiment. The memory system 1 may be a memory card, for example, a SD™ card or a solid state drive (SSD).

As illustrated in FIG. 1, the memory system 1 is able to be connected with a host device 2 and communicates with the host device 2. The host device 2 includes a power supply 21. The power supply 21 supplies power-supply voltage to the memory system 1. The power supply 21 may be provided outside the memory system 1 separately from the host device 2.

The memory system 1 includes a semiconductor nonvolatile memory 100, a memory controller 200, and a power supply control circuit 300. The memory system 1 may include two or more chips of nonvolatile memory 100. The power supply control circuit 300 receives a power-supply voltage from the power supply 21, includes a backup power supply 310 and supplies the power-supply voltage from the power supply 21 or the backup power supply 310 to the memory controller 200 and the nonvolatile memory 100. The backup power supply 310 includes a battery and/or a capacitor.

The memory controller 200 receives an instruction from the host device 2 and controls the nonvolatile memory 100 based on the received instruction. Specifically, the memory controller 200 writes data (host write data), for which writing (program) is instructed by the host device 2, into the nonvolatile memory 100 and reads data (host read data), for which reading is instructed by the host device 2 from the nonvolatile memory 100 and transmits the read data to the host device 2. The nonvolatile memory 100 is a non-volatile semiconductor memory and is, for example, a NAND flash memory.

The memory controller 200 includes a host interface 210, a control unit 220, a RAM 230, a memory interface 240, and an ECC circuit 250. The memory controller 200 includes, for example, a processor such as a central processing unit (CPU), a read only memory (ROM), and a random access memory (RAM) as hardware and executes some or all of the functions of each of the host interface 210, the control unit 220, the memory interface 240, and the ECC circuit 250 by causing the processor to execute firmware (program) stored in the ROM. Some or all of the functions of each of the control unit 220, the memory interface 240, and the ECC circuit 250 may be implemented in hardware.

The host interface 210 is connected with the host device 2 through a bus and manages communication between the memory controller 200 and the host device 2. The host interface 210 includes the SATA, SAS, PCI express, or the like and any other method that are compatible with the host interface may be employed. The control unit 220 is achieved by, for example, some of functions of the processor and RAM. The control unit 220 manages overall control of the memory controller 200, controls the memory interface 240, and controls cooperation of the RAM 230 and the memory interface 240.

RAM 230 temporarily holds pieces of data and functions as a buffer. The pieces of data include a piece of host write data, a piece of data ((encoded) write data) to be written into the nonvolatile memory 100, a piece of data ((encoded) memory read data) read from the nonvolatile memory 100, and a piece of management data indicating a state of the nonvolatile memory 100 and being referenced by the control unit 220 for controlling the nonvolatile memory 100. The buffer implemented with the RAM 230 includes a write buffer 230A and a data buffer 230B. The write buffer 230A holds a piece of host write data. The data buffer 230B holds a piece of (encoded) write data.

The memory interface 240 controls the nonvolatile memory 100 according to control of the control unit 220 and determines a state of the nonvolatile memory 100. The memory interface 240 is realized by, for example, some of functions of the processor and the RAM.

The memory interface 240 includes a command generation unit 241. The command generation unit 241 generates various commands for executing a request from the control unit 220 according to control of the control unit 220.

The ECC circuit 250 converts payload data which includes the host write data and management data into an error correction code (ECC) codeword. The error correction code is generated by a known method. The ECC codeword generally includes payload data and a piece of data for error correction. The piece of data for error correction includes, for example, a piece of parity data generated on the basis of the payload data. The ECC circuit 250 performs error correction on memory read data (in a form of ECC codeword) and attempts to acquire correct data (in which error is corrected) included in memory read data (for example, host read data). If the number of errors is less than or equal to correction capability determined by a technology of the error correction code and the ECC circuit 250, correct host read data may be acquired. When the memory read data includes more errors than the correction capability of the ECC circuit 250, the ECC circuit 250 notifies the control unit 220 that correct host read data is not acquired. The ECC circuit 250 can correct errors of which number is less than or equal to a reference value TN3 contained in the memory read data. Error correction capability by the ECC circuit 250 may be varied depending on settings of a code rate.

The ECC circuit 250 can generate a product code. Generating the product code includes, for example, generating other independent parity data from each bit string of a plurality of separate pieces of write data. The generated product code is also written into the nonvolatile memory 100 as an independent piece of write data. When an error of a certain piece of write data is not correctable, the error may be corrected from other write data and the independent piece of parity data by using the product code.

The memory interface 240 is connected to the nonvolatile memory 100 through a bus. When the nonvolatile memory 100 is a NAND flash memory, the bus is a NAND bus and the following description and drawings are based on an example of the NAND bus. The NAND bus transfers signals of CEn, CLE, ALE, WEn, REn, WPn, RY/BYn, DQ, DQS, and DQSn. In the present specification, n at the end of the name of signal indicates an inverted logic of a signal whose name does not have n at the end of the name, and means that the signal is asserted when being in a low level.

The signal DQ (DQ0 to DQ7) has, for example, a 8-bit width, and includes a command (CMD), (encoded) write data or memory read data (DAT), an address signal (ADD), status data (STA) and the like. Memory read data is referred to hereafter simply as read data.

An asserted signal CEn enables the nonvolatile memory 100. An asserted signal CLE is input to the nonvolatile memory 100 in parallel with the signal DQ to indicate that the signal DQ is indicating a command CMD. An asserted signal ALE indicates the nonvolatile memory 100 that the signal DQ input to the nonvolatile memory 100 in parallel with the signal ALE is indicating an address signal ADD. An asserted signal WEn instructs the nonvolatile memory 100 to store the signal DQ input to the nonvolatile memory 100 in parallel with the signal WEn. An asserted signal REn instructs the nonvolatile memory 100 to output the signal DQ. An asserted signal WPn instructs the nonvolatile memory 100 to prohibit writing and erasing of data. The signal RY/BYn indicates whether the nonvolatile memory 100 is in a ready state or in a busy state, and a busy state is indicated at a low level. The nonvolatile memory 100 receives an instruction from the memory controller 2 in the ready state and does not receive an instruction from the memory controller 2 in the busy state.

The signals DQS and DQSn sent from the memory controller 200 toward the nonvolatile memory 100 indicate the timing at which the signal DQ is to be captured. The signals DQS and DQSn sent from the nonvolatile memory 100 toward the memory controller 200 indicate the timing at which the signal DQ is to be captured.

When the memory system 1 includes a plurality of chips of nonvolatile memory 100, the signal DQ is shared by the plurality of chips of nonvolatile memory 100. For example, after the signal DQ is transmitted to a certain first chip of nonvolatile memory 100, the memory controller 200 transmits the signal DQ to another second chip of nonvolatile memory 100 while the first chip of nonvolatile memory 100 performs an operation based on the signal DQ. The first and second chips of nonvolatile memory 100 execute, for example, an instructed operation in parallel. Such an instruction may be transmitted exclusively to a single chip of nonvolatile memory 100, and parallel operation of a plurality of chips of nonvolatile memory 100 is performed by, not only two, but also three or more chips of nonvolatile memory 100.

<1.1.2. Nonvolatile Memory>

Figure 2:
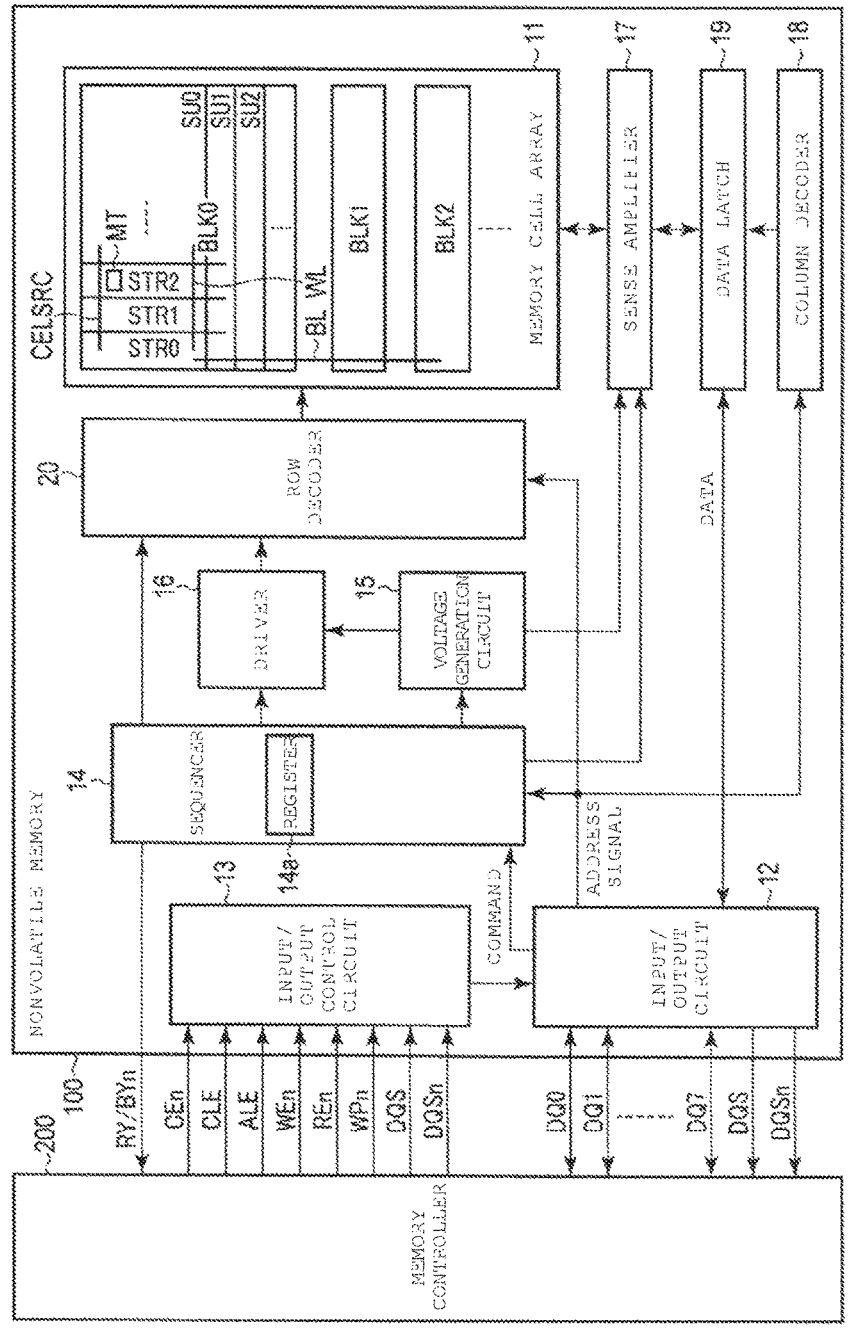
FIG. 2 is a diagram illustrating a functional block of a nonvolatile memory of the first embodiment.

FIG. 2 illustrates a functional block of the nonvolatile memory 100 of the first embodiment. As illustrated in FIG. 2, the nonvolatile memory 100 includes elements of a memory cell array (cell array) 11, an input/output circuit 12, an input/output control circuit 13, a sequencer (control circuit) 14, a voltage generation circuit 15, a driver 16, a sense amplifier 17, a column decoder 18, a data latch 19, and a row decoder 20.

The cell array 11 includes a plurality of memory blocks BLK (BLK0, BLK1, and . . . ). A block BLK is, for example, a unit of data erasure and data are collectively erased in each block BLK. However, data may be erased in a unit which is smaller than a single block BLK (for example, one half of block BLK).

Each block BLK includes a set of a plurality of string units SU (SU0, SU1, and . . . ). Each string unit SU is a set of a plurality of NAND strings STR (STR0, STR1, and . . . ). A string STR includes a plurality of memory cell transistors MT. In the cell array 11, wiring lines of a word line WL, a bit line BL, a cell source line CELSRC, selection gate lines SGDL and SGSL and the like are provided.

The input/output circuit 12 receives the signal DQ and transmits the signal DQ. The input/output circuit 12 transmits data strobe signals DQS and DQSn.

The input/output control circuit 13 receives various control signals from the memory controller 200 and controls the input/output circuit 12 based on the control signals. The control signals include signals CEn, CLE, ALE, WEn, REn, and WPn and the data strobe signals DQS and DQSn.

The sequencer 14 receives the command CMD and the address signal ADD from the input/output circuit 12 and controls the voltage generation circuit 15, the driver 16, the sense amplifier 17, and the column decoder 18 based on the command CMD and the address signal ADD. The sequencer 14 includes a register 14a and performs control based on values of various parameters in the register 14a.

The voltage generation circuit 15 receives power-supply from the outside of the nonvolatile memory 100 and generates various voltages from the power-supply. The generated voltage is supplied to elements such as the driver 16 or the sense amplifier 17. The voltage generated by the voltage generation circuit 15 includes, for example, voltage to be applied to the word line WL, the selection gate lines SGDL and SGSL, and the source line CELSRC. The driver 16 receives the voltages generated by the voltage generation circuit 15 and supplies selected voltages among the received voltages to the row decoder 20 according to control of the sequencer 14.

The row decoder 20 receives various voltages from the driver 16, receives the address signal ADD from the input/output circuit 12, selects a single block BLK based on the received address signal ADD, and transfers the voltage from the driver 16 to the selected block BLK.

The sense amplifier 17 senses a state of the cell transistor MT, generates memory read data based on the sensed state. The sense amplifier 17 transfers the write data to the cell transistor MT.

The data latch 19 holds write data DAT from the input/output circuit 12 and supplies the write data DAT to the sense amplifier 17. The data latch 19 receives memory read data DAT from the sense amplifier 17 and supplies memory read data DAT to the input/output circuit 12 according to control of the column decoder 18. The column decoder 18 controls the data latch 19 based on the address signal ADD.

<1.1.3. Cell Array>

Figure 3:
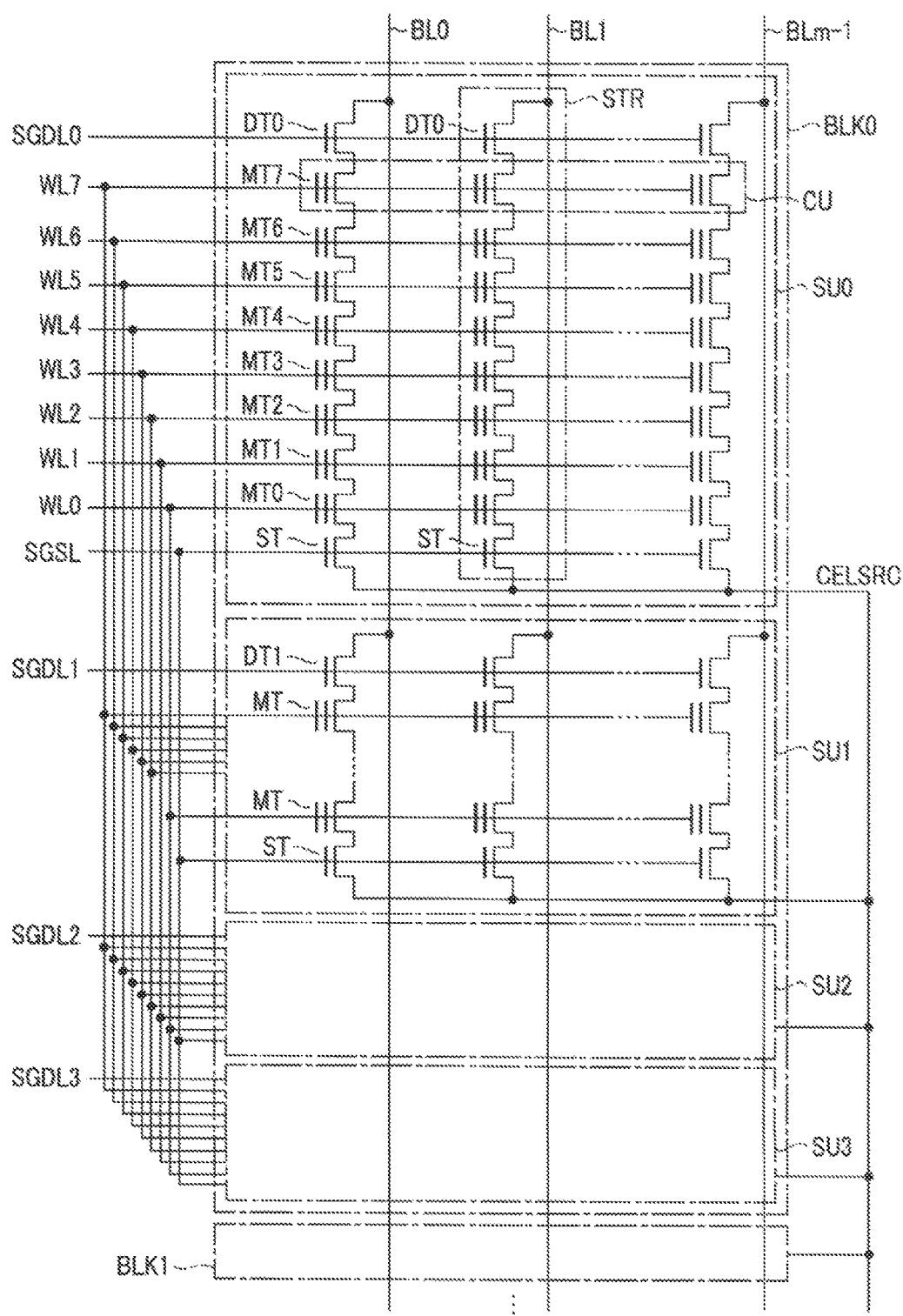
FIG. 3 is a diagram illustrating elements and connections of a single block of the first embodiment.

FIG. 3 illustrates an example of some elements and connections of the cell array 11, elements and connections of a single block BLK0, and other relevant elements. A plurality of (for example, all) blocks BLK include elements and connections illustrated in FIG. 3, respectively.

One block BLK includes string units SU0 to SU3. One block BLK, however, may include only a single string unit SU.

Each of m (m is a natural number) bit lines BL0 to BLm−1 is connected to a single string STR in each of four string units SU0 to SU3 in each block BLK.

Each string STR includes a single selection gate transistor ST, n (n is a natural number) memory cell transistors MT, and a single selection gate transistor DT (DT0 to DT3). Transistors ST, MT, and DT are connected in series between the source line CELSRC and a single bit line BL in this order. FIG. 3 illustrates an example of eight cell transistors MT0 to MT7. The cell transistor MT includes a control gate electrode and a charge trapping layer insulated from the surrounding and hold data in non-volatile based on an amount of charge within the charge trapping layer. Writing causes electrons to be injected (trapped) into the charge trapping layer of the cell transistor MT.

A single string unit SU is configured with a plurality of strings STR each of which is connected to one of a plurality of different bit lines BL. In each string unit SU, each of control gate electrodes (gate) of the cell transistor MT to MT7 is connected to one of word lines WL0 to WL7. In each block BLK, the word lines WL0 to WL7 within different string units SU are also connected to each other. A set of the cell transistors MT sharing a same word line WL within a single string unit SU is referred to as a cell unit CU.

Transistors DT0 to DT3 belong to string units SU0 to SU3, respectively. For each α (α is 0 or a natural number of 3 or less), a gate of each transistor DTα of a plurality of strings STR of a string unit SUα is connected to a selection gate line SGDLα. A gate of the transistor ST is connected to a selection gate line SGSL.

Figure 4:
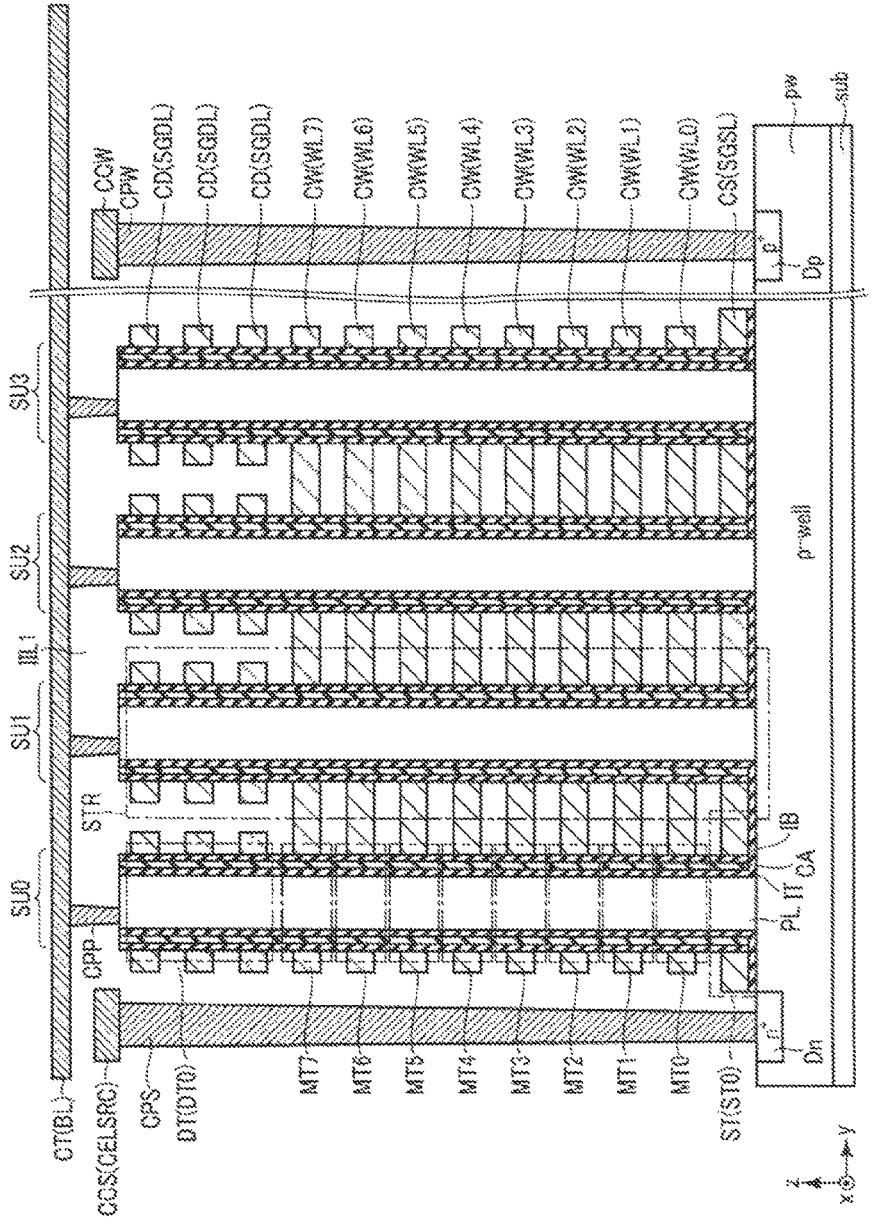
FIG. 4 is a diagram illustrating a sectional view of an example of a structure of the block of the first embodiment.

Each block BLK has the structure illustrated in FIG. 4. As illustrated in FIG. 4, a string unit SU is provided over a substrate sub. The substrate spreads along the xy-plane and includes a p type well region pw on the surface. Each string unit SU includes a plurality of strings STR aligned along the x-axis. Each string STR includes a semiconductor pillar PL. The pillar PL extends along the z-axis, contacts the well region pw in the bottom, and functions as a body and a channel region of the transistors MT, DT, and ST. The top of the pillar PL is connected to a conductor CT through a conductive plug CPP. The conductor CT extends along the y-axis, functions as a single bit line BL, is spaced apart from other conductors CT, which are positioned at other coordinates on the x-axis, at a predetermined interval. Side surface (outer surface) of the pillar PL is covered with tunnel insulators (layer) IT. The tunnel insulator IT spreads also on the well region pw. Side surface (outside) of the tunnel insulator IT is covered with charge trapping layers CA. The charge trapping layer CA is an insulating or conductive layer and side surface (outer surface) is covered with block insulators (layer) IB.

In each string unit SU, a single conductor CS, a plurality of conductors CW (for example, 8 CWs), and three conductors CD are provided above the well region pw. A plurality of conductors CS may also be provided. The conductors CS, CW, and CD are aligned along the z-axis at an interval in this order, extend along the x-axis, and contact the block insulator IB. The conductor CS and the surface of the well region pw sandwiches the tunnel insulator IT. The conductors CS, CW, and CD function as the selection gate line SGSL, the word line WL0 to WL7, and the selection gate line SGDL, respectively. In each string unit SU, the conductors CS, CW, and CD contact the block insulators IB on the side surfaces of all of the semiconductor pillars PL of the string unit SU.

Portions of the pillar PL, the tunnel insulator IT, the charge trapping layer CA, and the block insulator IB that intersect with the conductors CS, CW, and CD respectively function as the selection gate transistor ST, the cell transistor MT, and the selection gate transistor DT. A single string STR is configured with the transistors ST, MT, and DT sharing the pillar PL and being aligned along the z-axis.

In a region inside the surface of the well region pw, a p+ type impurities diffusion layer DP is provided. The diffusion layer DP is connected with a conductor CCW through a conductive plug (contact plug) CPW. The plug CPW spreads along the xz plane.

In the region inside the surface of the well region pw, an n+ type impurities diffusion layer DN is provided. The diffusion layer DN is connected with a conductor CCS through a conductive plug CPS. The conductor CCW functions as a cell source line CELSRC.

In a region where the conductors CS, CW, CD, CCS, and CCW and the plugs CPS and CPW are not provided, an insulator IIL1 is provided.

Figure 5:
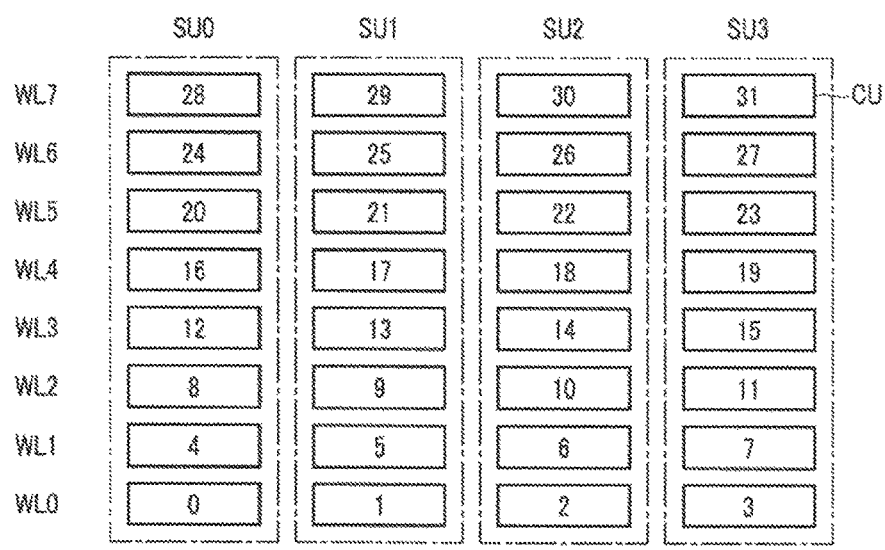
FIG. 5 is a diagram illustrating an example of address assignment of a cell unit in the first embodiment.
Figure 6:
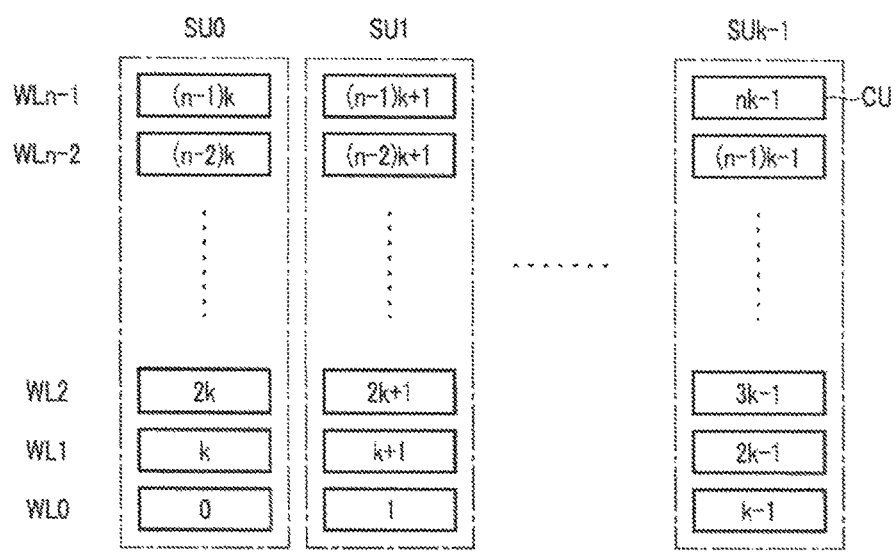
FIG. 6 is a diagram illustrating another example of address assignment of a cell unit in the first embodiment.

A unique physical address is assigned to each cell unit CU in a single chip of nonvolatile memory 100. FIG. 5 illustrates an example of address assignment in a single block BLK, e.g., block BLK0. As illustrated in FIG. 5, a minimum address (for example, 0) within the block BLK is assigned to the cell unit CU of the string unit SU0 connected with the word line WL0. A maximum address (for example, 31) within the block BLK is assigned to the cell unit CU of the string unit SU3 connected with the word line WL7. Addresses 1, 2, and 3 are respectively assigned to the cell units CU of the string units SU1, SU2, and SU3 of the word line WL0. Addresses 4, 5, 6, and 7 are assigned to the cell units CU of the string units SU0, SU1, SU2, and SU3 connected with the word line WL1. Similarly, addresses are assigned to four cell units CU of a certain word line WL in ascending order of a string unit SU and addresses are aligned in ascending order of an address of a word line WL. In a next block, e.g., block BLK1, addresses are assigned in a similar manner beginning with the next address after the maximum address of block BLK0. FIG. 6 illustrates an example of address assignment in a case where a single block BLK includes k string units SU and a single string STR includes n cell transistors MT. However, the address assignment scheme of FIGS. 5 and 6 is one example, respectively. Addresses may be assigned in a manner different from that in FIGS. 5 and 6.

When (encoded) write data is to be written into the nonvolatile memory 100 or memory read data is to be read from the nonvolatile memory 100, the memory controller 200 specifies a cell unit CU which is a reading target or a writing target by a physical address in an address signal ADD.

<1.1.4. Cell Transistor>

Figure 7:
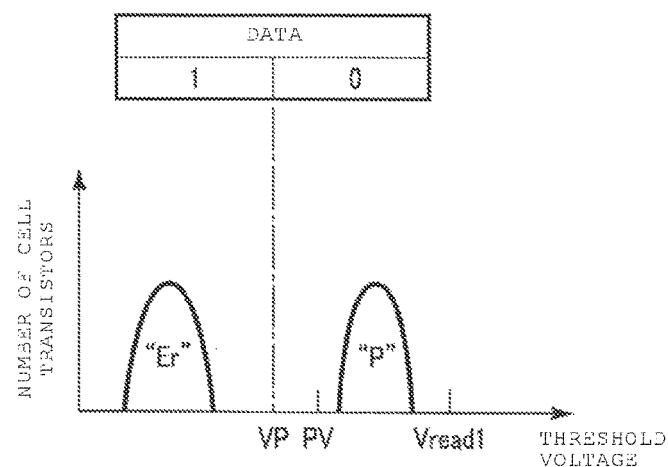
FIG. 7 is a diagram illustrating a first example of holding of data in the nonvolatile memory of the first embodiment.

The nonvolatile memory 100 can hold data of one or more bits in a single cell transistor MT. FIG. 7 illustrates, as a result of writing (programming), a distribution of threshold voltages of the cell transistors MT in which 1-bit data per a single cell transistor is held (i.e. an SLC mode; a single level cell mode). The threshold voltage of each cell transistor MT has a value according to 1-bit data which is held. Each cell transistor MT may have any of two modes of threshold voltages, corresponding Er and P states.

A plurality of cell transistors MT holding the same 1-bit data (e.g., 0 or 1) may have different threshold voltages from each other due to variations in characteristics of the cell transistor MT. For that reason, the threshold voltages of the plurality of cell transistors MT holding the same data defines a distribution. As between two threshold voltages, the cell transistors MT belonging to the lower threshold voltages have an Er state and the cell transistors MT belonging to the upper threshold voltages have a P state. The Er state corresponds to an erased state. In general, data is written into the cell transistor MT which is in the erased state. The Er state and P state are respectively handled as, for example, states holding data of "1" and data of "0". A different correspondence, however, may be used for the state and data to be held.

The threshold voltage of the cell transistor MT which is in a P state is higher than the threshold voltage of the cell transistor MT which is in the Er state. The cell transistor MT having the threshold voltage greater than or equal to a read voltage VP is determined as being in the P state and remains in an off state even when the read voltage VP is applied to its control gate electrode. On the other hand, the cell transistor MT having the threshold voltage less than the read voltage VP is turned on when the read voltage VP is applied to its control gate electrode. The read pass voltage Vread1 is applied to the control gate electrode of the cell transistor MT which is a non-reading target and is higher than any of the threshold voltages of the cell transistors MT.

While writing (programming) is performed, the verification voltage PV is used in order to confirm completion of the writing (verification). The verification refers to confirmation whether programming of the cell transistor MT to which data is to be programmed has completed. If the cell transistor (selected cell transistor) MT to which data is to be written has a threshold voltage greater than or equal to a voltage PV, it is determined that writing into the cell transistor MT has completed.

Figure 8:
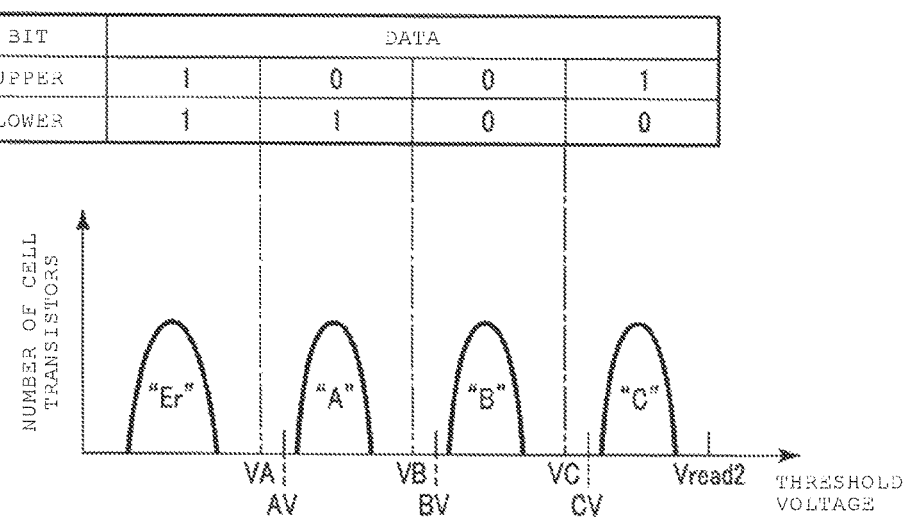
FIG. 8 is a diagram illustrating a second example of holding of data in the nonvolatile memory of the first embodiment.

FIG. 8 illustrates, as a result of writing (programming), a distribution of threshold voltages of the cell transistors MT in which 2-bit data is held per cell transistor (i.e. an MLC mode; a multi-level cell mode). The threshold voltage of each cell transistor MT has a value corresponding to any of four modes of threshold voltages. The cell transistors MT that belong respectively to four modes in order from the lowest mode are respectively in the Er state, A state, B state, and C state. The Er state, A state, B state, and C state are managed as, for example, states holding "11" data, "01" data, "00" data, and "10" data, respectively. A different correspondence, however, may be used for the state and data to be held.

The threshold voltages of the cell transistors having the A state, B state, and C state are higher than the threshold voltages of the cell transistors having the Er state, A state, and B state, respectively. The cell transistor MT having the threshold voltage less than the read voltage VA is determined as being in the Er state. The cell transistor MT having the threshold voltage greater than or equal to the read voltage VA and less than the read voltage VB is determined as being in the A state. The cell transistor MT having the threshold voltage greater than or equal to the read voltage VB and less than the read voltage VC is determined as being in the B state. The cell transistor MT having the threshold voltage greater than or equal to the read voltage VC is determined as being in the C state. The cell transistor MT having the threshold voltage greater than or equal to the read voltages VA, VB, and VC respectively remain in an off state even when the read voltages VA, VB, and VC are respectively applied to the control gate electrode thereof. On the other hand, the cell transistors MT having the threshold voltages less than the read voltages VA, VB, and VC are respectively turned on when the read voltages VA, VB, and VC are applied to the control gate electrode thereof. The read pass voltage Vread2 is applied to the control gate electrode of the cell transistor MT which is a non-reading target and is higher than any of the threshold voltages of the cell transistors MT.

When multiple-bit data is held per cell transistor MT, a single page is made up of a set of bits in the same bit-position of the cell transistors MT of a single cell unit CU. When 2-bit data is held per a single cell transistor MT, an upper page is made up of high-order bits of the cell transistors MT of a single cell unit CU. A lower page is made up of low-order bits of the cell transistors MT of a single cell unit CU.

In order to verify programming of A state, B state, and C state, verification voltages AV, BV, and CV are used. When the selected cell transistors MT to be programmed at the A state, B state, and C state have threshold voltages greater than or equal to the verification voltages AV, BV, and CV, respectively, it is determined that programming to the cell transistor MT programmed to be the corresponding level is completed. The verification voltages BV and CV are higher than the verification voltages AV and BV, respectively.

In further embodiment, data of 3-bit (a TLC mode; a triple level cell mode) or more may also be held per cell transistor MT by expanding the principles described above.

<1.2. Operation>
<1.2.1. Overall Operation>

Figure 9:
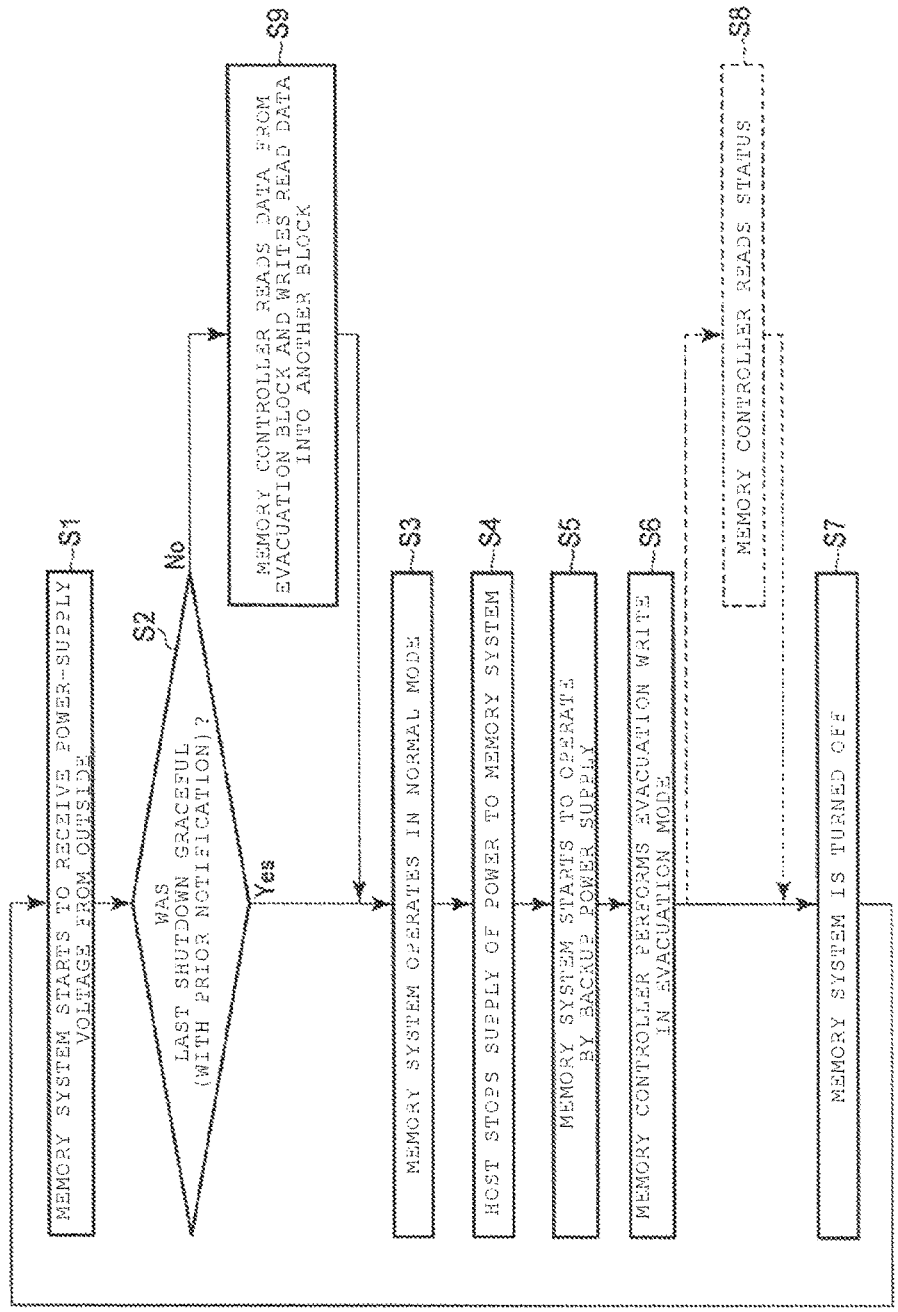
FIG. 9 is a flowchart illustrating a process of an overall operation of the memory system of the first embodiment.

FIG. 9 illustrates a process of an overall operation of the memory system 1. As illustrated in FIG. 9, the memory system 1 receives the power-supply voltage from outside, for example, the power supply 21, and starts to operate (Step S1). Next, the memory controller 200 determines whether the last shutdown (the stopping of supply of the power-supply voltage from the outside of the memory system 1) has occurred without prior notification from the host device 2 (Step S2). For example, stopping of supply of the power-supply voltage may be caused by a user of the host device 2 and performed without particular notification (an abrupt shutdown). Accordingly, stopping of supply of the power-supply voltage from the host device 2 to the memory system 1 may not be notified before the stopping. When supply of the power-supply voltage from the outside is stopped, the memory controller 200 saves information indicating whether prior notification is made or not in a block BLK of the nonvolatile memory 100. In Step S2, the memory controller 200 obtains information about the presence/absence of the prior notification. In the case of absence of the prior notification, evacuation block(s) into which the memory controller 200 performed an evacuation write in the last shutdown process needs to be freed up in preparation for a possible subsequent shutdown without prior notification.

When the prior notification has been made (a graceful shutdown) (Yes branch in Step S2), the memory system 1 operates in a normal mode (Step S3). In the normal mode, the memory system 1 is in a normal state. In the present specification, the normal state refers to a state in which the memory system 1 receives the power-supply voltage from outside (for example, from the host device 2). In the normal mode, the memory system 1 performs various operations according to the received instruction from the host device 2.

In the normal mode, the memory controller 200 writes write data into a block BLK in response to a writing instruction from the host device 2.

The host device 2 stops supplying the power-supply voltage to the memory system 1 (Step S4). Stopping of supply of the power-supply voltage may be caused by, for example, a user of the host device 2 and performed without prior notification as described above.

The power supply control circuit 300 monitors whether the power-supply voltage is being supplied from the host device 2 and detects stopping of the supply of the power-supply voltage when the supply of the power-supply voltage is stopped. When it is determined that the supply of the power-supply voltage from the host device 2 is stopped, the power supply control circuit 300 starts to supply the power-supply voltage from the backup power supply 310 to the memory controller 200 and the nonvolatile memory 100 (Step S5). With this, the memory system 1 starts to operate by the power-supply voltage from the backup power supply 310.

The memory controller 200 operates in an evacuation mode while being operated by the power-supply voltage from the backup power supply 310. In the evacuation mode, the nonvolatile memory 100 obtains a single or a plurality of parameters with a setting (a value) different from that in the normal mode. A method for performing operation in the evacuation mode will be described later. The memory controller 200 performs evacuation write in the evacuation mode (Step S6). The evacuation write is usually performed in the evacuation mode and includes writing, into the nonvolatile memory 100, of specific data stored in the RAM 230 which are not yet written into the nonvolatile memory 100 (dirty data). The backup power supply 310 has a limited capacitance and can supply the power-supply voltage to the memory controller 200 and the nonvolatile memory 100 only for a limited period of time. Accordingly, the evacuation write needs to be completed during the limited period of time. The memory system 1 is configured so that the evacuation write is completed while the power-supply voltage is being supplied by the backup power supply 310. Details of the configuration will be described later.

The memory controller 200 reserves (pools) a predetermined number of blocks BLK that are in the erased state in order to prepare for the evacuation write. That is, the memory controller 200 maintains the predetermined number of blocks BLK in the erased state while in the normal mode. The memory controller 200 performs the evacuation write on the block BLK described above. A block to be subjected to the evacuation write can be dynamically assigned from among the pooled blocks in the erased state at the timing of the shutdown, instead of being fixedly assigned. A block of the pooled erased blocks is assigned to a destination of a normal write process instead, if any shutdown does not occur during when the block is on duty.

After the evacuation write, the memory controller 200 does not perform a step (S8) for reading from the nonvolatile memory 100 a status about a result of the evacuation write of the nonvolatile memory 100. For that reason, the memory controller 200 does not determine the result of evacuation write and does not perform a step for retry writing. The retry writing may be performed when writing of data to cell unit CU has failed, and includes writing of the same data again into another cell unit CU. The retry writing is performed usually in normal write process. However, in the embodiments, the memory controller 200 does not perform retry writing (Step S8).

During the evacuation write, the memory controller 200 writes, into a block BLK, a piece of data indicating whether stopping of the supply of the power-supply voltage from the host device 2 has occurred with or without receiving the prior notification from the host device 2.

After passing a period of time during which the supply of the power-supply voltage by the backup power supply 310 is possible, the memory system 1 is turned off (Step S7). After that, when the memory system 1 starts to receive the power-supply voltage from outside, for example, the power supply 21 (Step S1), the memory system 1 is activated again.

If last stopping of supply of the power-supply voltage is occurred without prior notification (an abrupt shutdown) (No branch in Step S2), the process makes transition to Step S9. In Step S9, the memory controller 200 relocates the data subjected to the evacuation write, that is, the memory controller 200 reads memory read data from the block BLK subjected to the evacuation write, performs error correction on the obtained memory read data, writes the memory read data of which error is corrected into another block BLK by the normal write. After that, the memory system 1 makes transition to Step S3. In the following, a block subjected to the evacuation write is referred to as an evacuation block BLKb. After the relocating, data in the evacuation block BLKb is erased at an appropriate timing.

In the evacuation write, alternatively, data may be written into a specific block BLK. For example, a specific block BLK that is fixedly assigned may be used as an evacuation write destination and remaining blocks are used in the normal mode among all blocks BLK capable of being used by the memory controller 200.

<1.2.2. Writing in Normal Mode>

Figure 10:
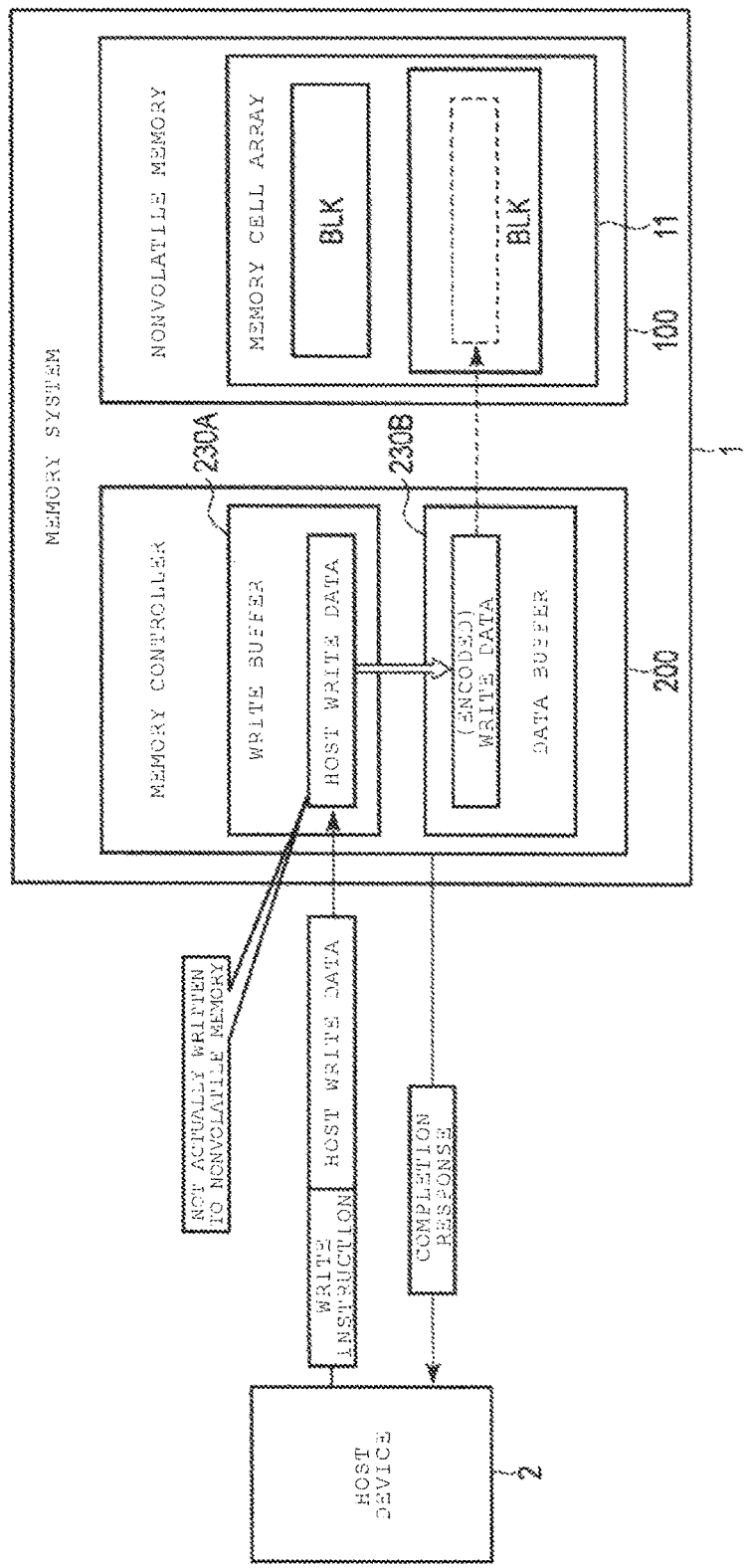
FIG. 10 is a diagram illustrating an outline of data writing in a normal mode of the memory system of the first embodiment.

FIG. 10 illustrates an outline of data writing in a normal mode, that is, during normal period. In the following, writing in the normal mode is referred to as normal write.

The memory system 1 receives writing instruction and host write data associated with the instruction from the host device 2. When all of the host write data associated with the instruction has been received, the memory controller 200 transmits a completion response of the instruction to the host device 2. At this timing, host write data is stored in the write buffer 230A, and is not yet actually programmed into the nonvolatile memory 100 yet. The memory controller 200 does not immediately write the host write data into the nonvolatile memory 100. Instead, the memory controller 200 accumulates the host write data in the write buffer 230A to a certain amount and then writes the accumulated host write data into a block BLK. Specifically, for example, when a predetermined amount of host write data is accumulated in the write buffer 230A (in the RAM 230), the memory controller 200 starts to transfer host write data to the nonvolatile memory 100 for writing, by generating (encoded) write data by appending parity data to the host write data in the data buffer 230B and transferring the generated write data into the nonvolatile memory 100. In the following, the host write data that is not programmed into the nonvolatile memory 100 yet and of which completion response has already been transmitted to the host device 2 is referred to as dirty data. A dirty data is not limited to a host write data, but may include a management data of the memory controller 200 such as a piece of a logical-to-physical address translation table.

Figure 11:
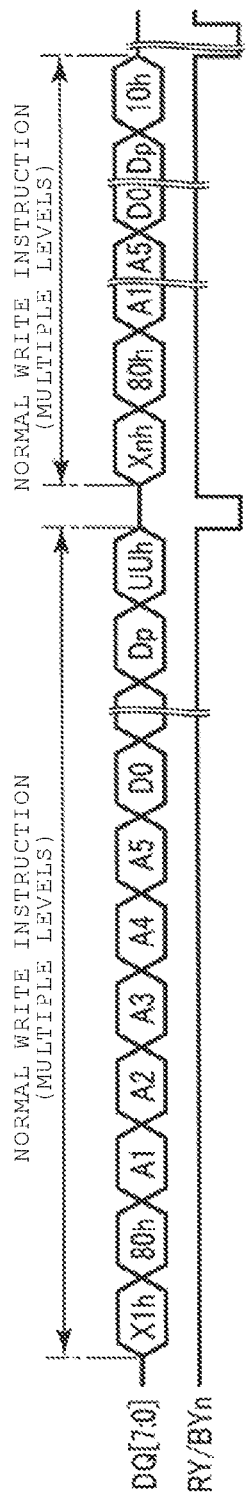
FIG. 11 is an example of a signal DQ for transmitting an instruction of normal write in the first embodiment.

FIG. 11 illustrates an example of a signal DQ input to the nonvolatile memory 100 from the memory controller 200 for transmitting an instruction of normal write. FIG. 11 also illustrates a signal RY/BYn. The nonvolatile memory 100 recognizes the normal write instruction illustrated in FIG. 11.

The normal write instruction includes a command X1h, a command 80h, address signals A1 to A5 over 5 cycles, write data D0 to Dp (p is a natural number), and a hold command UUh.

The write command 80h instructs that a plurality of bits (multi-bits) are to be written per cell transistor MT. The command X1h indicates that data for a first bit among a plurality of bits of cell transistors MT follows and when 2-bit are to be stored per a single cell transistor MT, indicates that data of a lower page follows.

The address signals A1 to A5 designate a write target region in a block BLK among of the plurality blocks of the nonvolatile memory 100, and include an address of a word line (selected word line) WL, that is connected to a cell unit (selected cell unit) CU including cell transistors MT which provide a storing space for a write target page (selected page). A cell transistor MT within the selected cell unit CU is referred to as a selected cell transistor MT. The word lines WL other than the selected word line WL are referred to as non-selected word lines WL.

The write data (D0 to Dp) has the same size as a page. The hold command UUh indicates that an instruction to write data of another page (a set of bits at another bit position) into the selected cell unit CU follows.

The writing instruction for data of another page of the selected cell unit CU and write data are transmitted from the memory controller 200 to the nonvolatile memory 100. In order to indicate transmission of data for a different page, a different command (X2h, Xnh or the like) precedes the write command 80h. When a writing instruction for all pages to be written into the selected cell unit CU and the write data have been transmitted to the data latch 19 of the nonvolatile memory 100, the execution command 10h is transmitted instead of the hold command UUh. When the execution command 10h is received, the nonvolatile memory 100 starts to program the instructed write data into the selected cell unit CU. During programming, the nonvolatile memory 100 continues to output a signal RY/BYn (of a low level) indicating a busy state.

Figure 12:
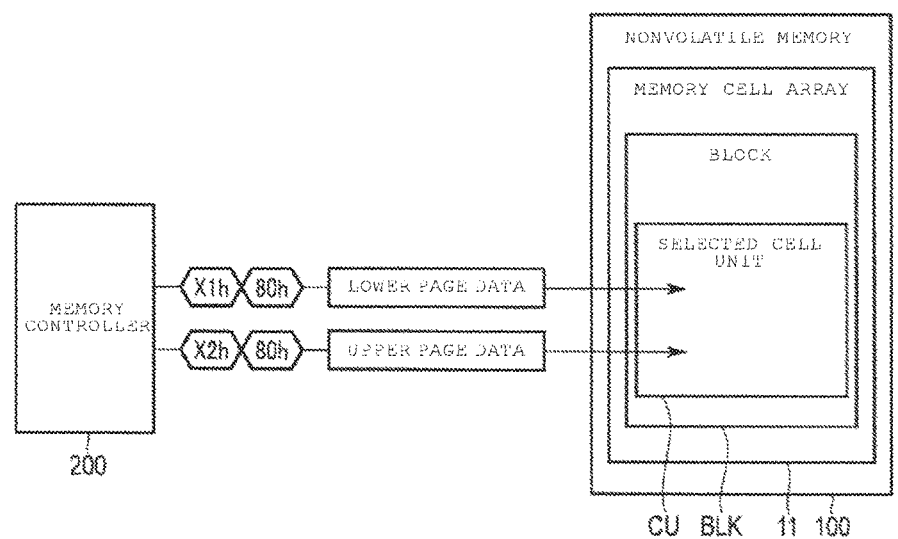
FIG. 12 is a diagram illustrating a flow of signals in normal write in the first embodiment.

In response to the normal write instruction, the nonvolatile memory 100, as illustrated in FIG. 12, writes data (lower page data and upper page data in this example) of a plurality of pages into the selected cell unit CU.

Figure 13:
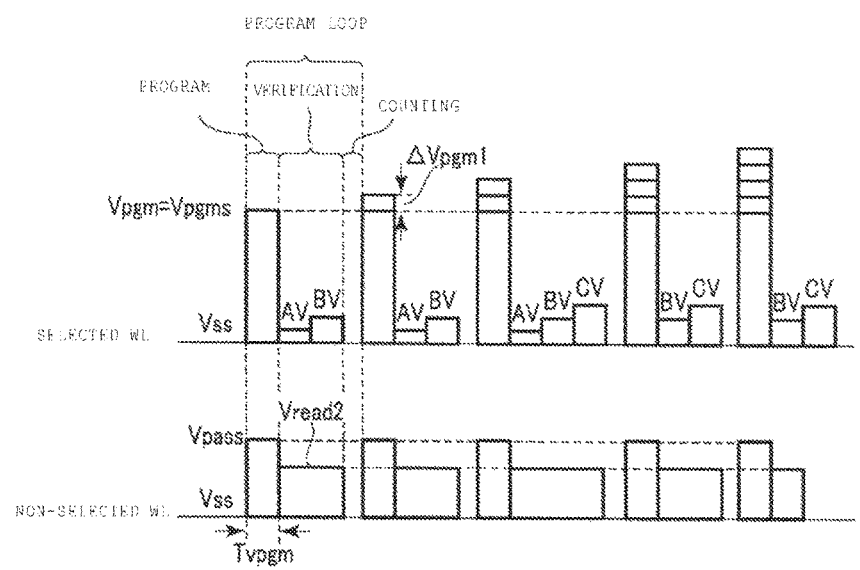
FIG. 13 is a diagram illustrating voltages applied to a word line during normal write in the first embodiment.

The normal write includes a plurality of program loops illustrated in FIG. 13. FIG. 13 illustrates voltages applied to the selected word line WL and the non-selected word line WL over time during the programming in the nonvolatile memory 100 of the first embodiment.

Each program loop includes programming process, verification process, and counting process. Programming process includes applying of a program voltage Vpgm to a selected word line WL. During programming process, several of a plurality of selected cell transistors MT forms a voltage difference, which is equivalent (substantially equal) to the program voltage Vpgm, between the channels and the word lines WL due to application of the program voltage Vpgm to the selected word line WL in order to raise the threshold voltage. However, a voltage difference as large as the program voltage Vpgm is not formed between the channels and the selected word lines WL even by application of the program voltage Vpgm to the remaining selected word lines WL among a plurality of selected cell transistors MT. Whether a certain selected cell transistor MT generates or does not generate a voltage difference, which is equivalent to the program voltage Vpgm, between the channel and the selected word lines WL is based on write data. In the following, a string STR including a selected cell transistor MT by which a potential difference of approximately equal to the program voltage Vpgm is generated is referred to as a programmable string STR. On the other hand, a string STR including a selected cell transistor MT by which a potential difference of approximately equal to the program voltage Vpgm is not generated is referred to as a program inhibited string STR. During programming process, the sequencer 14 continues applying the voltage Vss to the bit line BL connected with the programmable string STR and continues applying the voltage Vinh to the bit line BL connected with the program inhibited string STR. The voltage Vss is, for example, 0 V, the voltage Vinh is higher than the voltage Vss and is, for example, the power-supply voltage Vdd.

During the programming process, the sequencer 14 continues applying the voltage Vsgd to the selection gate line SGDL of a string unit (selected string unit) SU including a selected cell unit CU and continues applying the voltage Vss to the selection gate line SGSL. The voltage Vsgd has the magnitude that causes the selection gate transistor DT in the programmable string STR to be on and the selection gate transistor DT within the program inhibited string STR to be off.

While the voltage is applied to the bit line BL and the selection gate lines SGDL and SGSL, the sequencer 14 applies the voltage Vpgm to the selected word line WL and applies the program pass voltage Vpass to the non-selected word line WL over a program voltage application time Tvpgm. The program pass voltage Vpass has the magnitude capable of raising the channel potential by coupling to a degree such that an increase of threshold voltage in the selected cell transistor MT can be prevented in the program inhibited string STR while preventing an increase of the threshold voltage of a non-selected cell transistor MT in the programmable string STR. As the result of the application of the voltages Vpgm and Vpass, the program voltage Vpgm is applied to the selected word line WL in the cell transistor, which is included in the programmable string STR, among the selected cell transistors MT and electrons are injected into the charge trapping layer of the cell transistor. Few or no electrons are injected into the selected cell transistor MT of the program inhibited string STR.

In step-up programming process, program voltages Vpgm differ in different program loops. The program voltage Vpgm in each program loop is higher than the program voltage Vpgm in the preceding program loop by an increment ΔVpgm1. In the first program loop, a start program voltage Vpgms is applied to the selected word line WL.

During verification process, the sequencer 14 applies the voltage Vsg to the selection gate line SGDL and the selection gate line SGSL of the selected string unit SU of the selected cell unit CU. The voltage Vsg has the magnitude capable of turning the selection gate transistor SDT and SST on. The sequencer 14 applies the read pass voltage Vread2 to the non-selected word line WL, applies the verification voltages AV, BV, or CV or two or more of the verification voltages AV, BV, and CV to the selected word line WL in sequence. A string STR including a selected cell transistor MT passing the verification in a certain program loop is managed as the program inhibited string STR in the next program loop and succeeding program loops.

Figure 14:
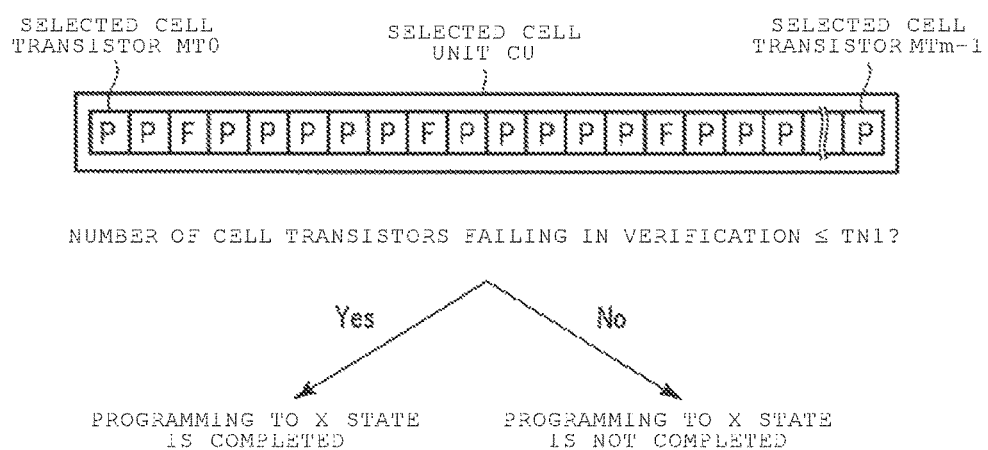
FIG. 14 is a diagram illustrating a counting process in normal write in the first embodiment.

In counting process, as illustrated in FIG. 14, the sequencer 14 counts selected cell transistors MT which does not have a threshold voltage greater than or equal to a verification voltage XV (failing in the verification) (labeled as a character "F" in FIG. 14), among all the selected cell transistors MT which are to be programmed to a certain state X (X is A, B, or C). The sequencer 14 counts the selected cell transistor MT failing in the verification (fail bit) among all the selected cell transistors MT which are to be programmed to the X state. When the counted number is less than or equal to a reference value TN1 (≤TN3), the sequencer 14 determines that programming of the selected cell transistor MT to the X state is completed. The reference value TN1 is determined based on, for example, data error correction capability and the error correction unit (ECC codeword) of the ECC circuit 250. As long as there is a state in which the program is not completed, the program loop is repeated up until the maximum number of program loops has been reached. When it is determined that the program is completed for all states, the programming process is finished. When the programming process is finished, the nonvolatile memory 100 turns the signal RY/BYn to a high level and to indicate a ready state. When the programming process is not completed and the maximum number of program loops has been reached, the nonvolatile memory 100 indicates a failed state for the writing.

The memory controller 200 transmits a certain command prior to the write command 80h to instruct that 1-bit data per a single cell transistor MT (SLC) is to be programmed into the nonvolatile memory 100. In the following, writing 1-bit data per cell transistor MT in the normal mode is referred to as a normal single level write. In the following, writing multiple-bit data per cell transistor MT in the normal mode illustrated in FIGS. 11 and 12 will be simply referred to as the normal write or normal multiple-level write.

Figure 15:
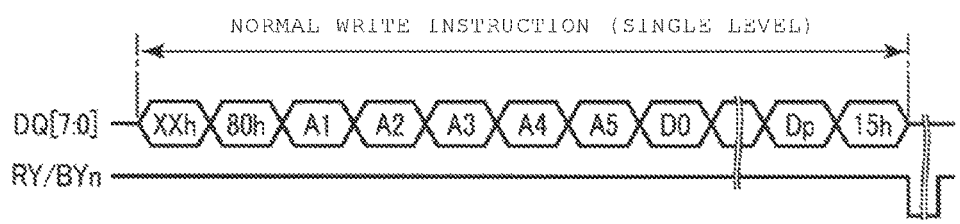
FIG. 15 is a diagram illustrating an example of a signal DQ for transmitting an instruction of normal single level write in the first embodiment.

FIG. 15 illustrates an example of a signal DQ input to the nonvolatile memory 100 from the memory controller 200 for transmitting the instruction of the normal single level write. The nonvolatile memory 100 recognizes the normal single level write instruction illustrated in FIG. 15.

The normal single level write instruction includes a command XXh, a write command 80h, address signals A1 to A5, write data D0 to Dp, and an execution command 15h. The address signals A1 to A5 include an address of the selected word line WL. When the command 15h is received, the nonvolatile memory 100 starts to program the received write data into the selected cell unit CU.

Figure 16:
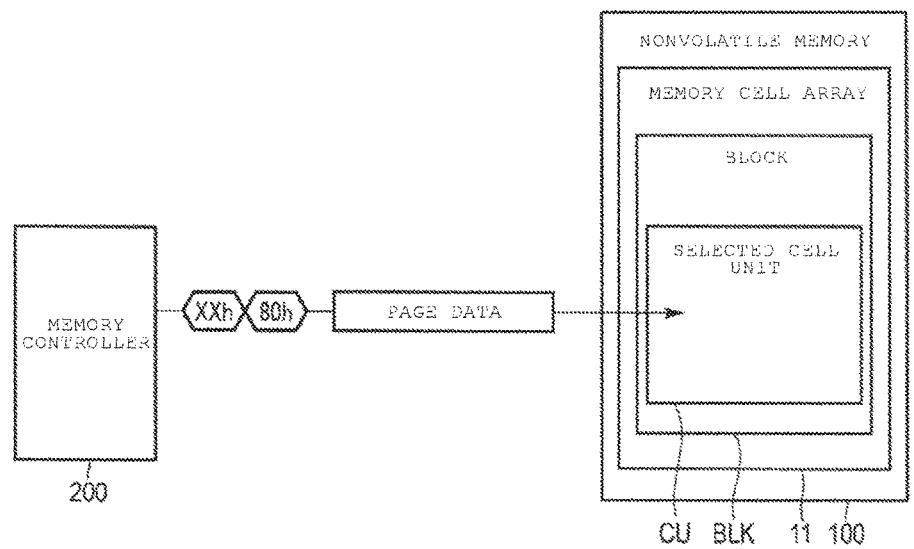
FIG. 16 is a diagram illustrating a flow of a signal in normal single level write in the first embodiment.

In response to the normal single level write instruction, the nonvolatile memory 100 programs data of a single page into the selected cell unit CU as illustrated in FIG. 16.

Figure 17:
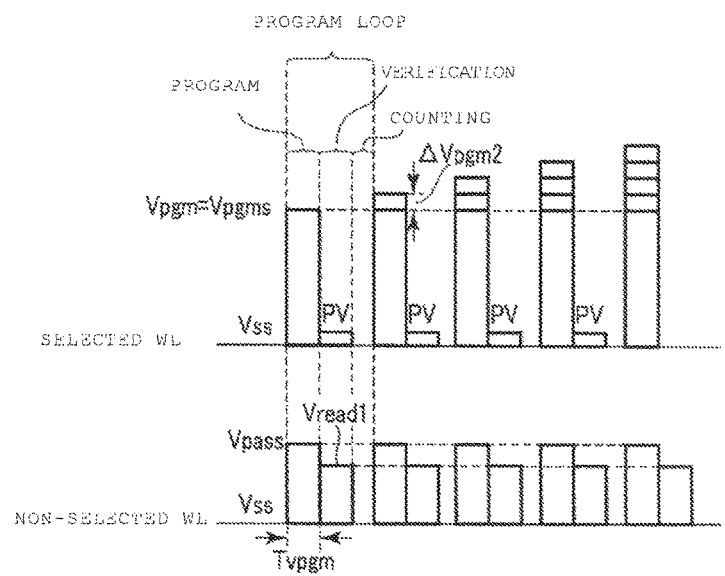
FIG. 17 is a diagram illustrating voltages applied to a word line during normal single level write in the first embodiment.

Similarly to the normal multiple-level write, the normal single level write includes a plurality of program loops as illustrated in FIG. 17. FIG. 17 illustrates voltages applied to the selected word line WL and the non-selected word line WL over time during the normal single level write in the nonvolatile memory 100 of the first embodiment. The normal single level write is different from the normal multiple-level write in the number of levels of the verification voltages applied in each program loop. In the normal single level write, each verification process includes an application of only a single verification voltage PV. During the verification process, the read pass voltage Vread1 is applied to the non-selected word line WL.

The program voltage Vpgm in each program loop is higher than the program voltage Vpgm in the previous program loop by an increment ΔVpgm2. The increment ΔVpgm2 may be the same as or different from the increment ΔVpgm1 for the normal multiple-level write.

Also, counting process in the normal single level write is performed basically in the same way as in the normal multiple-level write (see FIG. 14). However, counting process is performed for a single level because the selected cell transistor MT has a single state other than the Er state. As in the case of the normal multiple-level write, the counted number is compared with the reference value TN1.

<1.2.3. Data Protection in Evacuation Write>

In Step S6 of FIG. 9, the memory controller 200 generates (encoded) write data by appending parity data to payload data (such as dirty data) during the evacuation write to the nonvolatile memory 100. Further, the control unit 220 of the memory controller 200 may generate a product code from a plurality of write data using the ECC circuit 250. The product code is written into the nonvolatile memory 100 as another piece of write data. Alternatively or additionally, the memory controller 200 can replicate the write data and write the replicated copies of the write data into a plurality of cell units CU of the same or another block BLK based on the same data (for example, host write data). The product code and/or replicated data written in the evacuation write is erased at an appropriate timing during the normal mode after relocating of the dirty data saved by the evacuation write to another block BLK (Step S9) in the normal write mode is completed.

<1.2.4. Evacuation Write>

In the evacuation write process, 1-bit write per cell transistor (SLC programming) is performed with a different setting (value) for a single or a plurality of parameters from the one in the normal mode. More specifically, a parameter having a value different from the value in the normal single level write mode is used in the evacuation write. The evacuation write instruction can be instructed by a plurality of methods. The plurality of methods include using a dedicated command and using a combination of changing a parameter and issuing a generic command.

<1.2.4.1. Evacuation Write by Dedicated Command>

Figure 18:
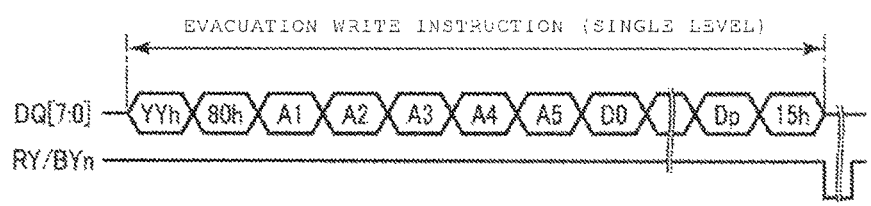
FIG. 18 is a diagram illustrating an example of a signal DQ for transmitting an instruction of evacuation write in the first embodiment.

The memory controller 200 transmits an evacuation write instruction to the nonvolatile memory 100 for the evacuation write. FIG. 18 illustrates an example of a signal DQ input to the nonvolatile memory 100 from the memory controller 200 for transmitting the instruction of the evacuation write. The nonvolatile memory 100 recognizes the evacuation write instruction illustrated in FIG. 18.

Figure 19:
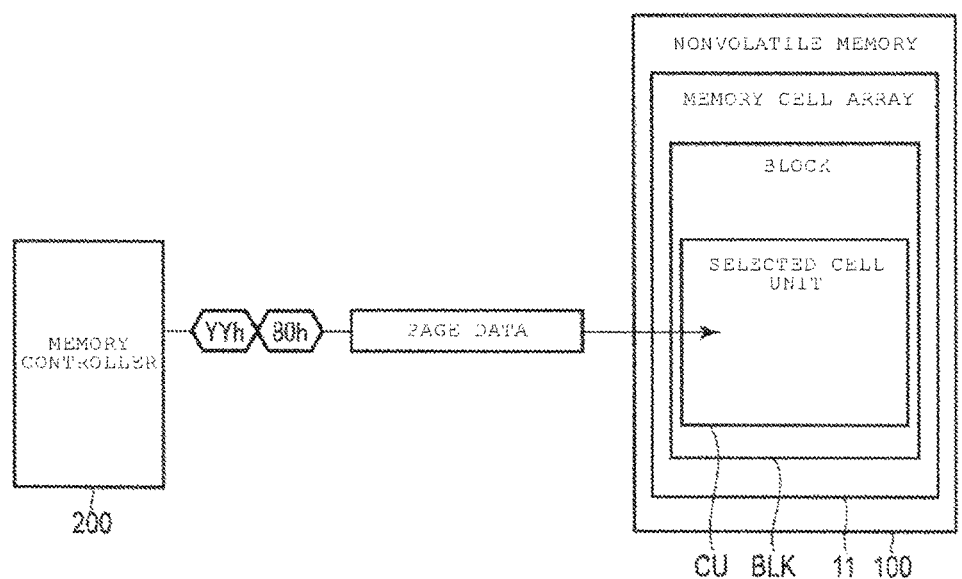
FIG. 19 is a diagram illustrating a flow of a signal in evacuation write in the first embodiment.

The evacuation write instruction includes a command YYh, a write command 80h, address signals A1 to A5, write data D0, . . . , Dp, and a command 15h. When the evacuation write instruction is received, as illustrated in FIG. 19, the nonvolatile memory 100 writes data of a single page into the selected cell unit CU in a block BLK. As in the normal single level write, data of a single page is written into the selected cell unit CU in the evacuation write.

Figure 20:
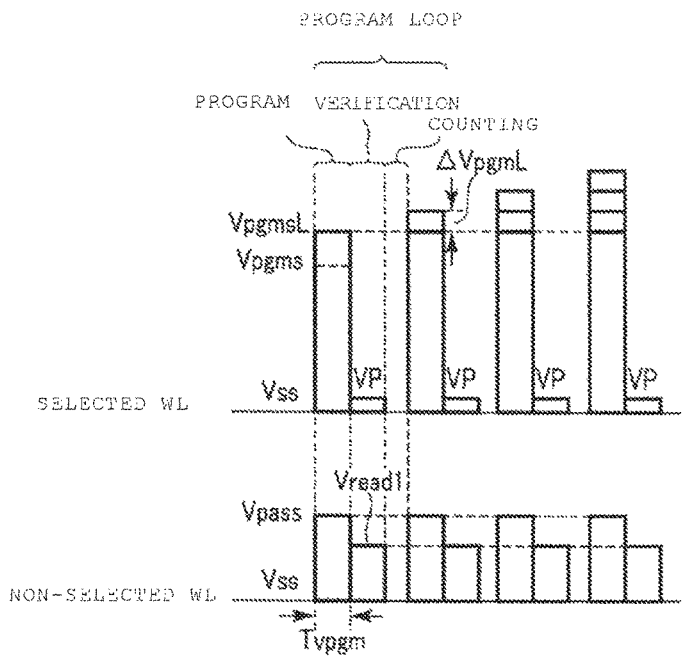
FIG. 20 is a diagram illustrating voltages applied to a word line during evacuation write in the first embodiment.

The evacuation write has some features that are the same as those in the normal single level write. As one of the same features, as illustrated in FIG. 20, a plurality of program loops are included in the evacuation write. FIG. 20 illustrates voltages applied to a selected word line WL and a non-selected word line WL over time during the evacuation write in the nonvolatile memory 100 of the first embodiment.

On the other hand, the evacuation write has some different features from the normal single level write, as described in the following. Firstly, as illustrated in FIG. 20, the sequencer 14 can apply the start program voltage VpgmsL to the selected word line WL in the first program loop in the evacuation write. The start program voltage VpgmsL is greater than the start program voltage Vpgms in the normal single level write.

Secondly, as illustrated in FIG. 20, the sequencer 14 can increase, as the number of program loops increases, a value of the program voltage Vpgm by an increment ΔVpgmL in the evacuation write. The increment ΔVpgmL is greater than the increment ΔVpgm2 in the normal single level write mode.

Figure 21:
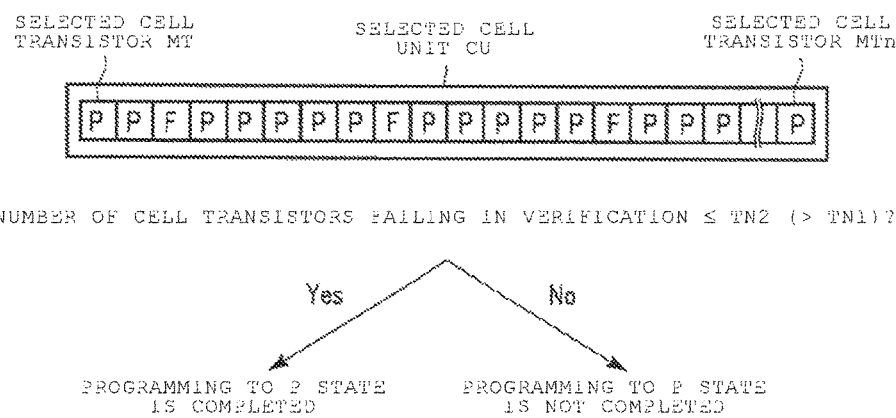
FIG. 21 is a diagram illustrating counting process in evacuation write in the first embodiment.

Thirdly, as illustrated in FIG. 21, the sequencer 14 can use a reference value TN2 (TN3) in the evacuation write instead of the reference value TN1. The reference value TN2 in the evacuation write is greater than the reference value TN1 in the normal single level write mode. That is, in the evacuation write, the sequencer 14 determines that writing is completed even when there remain more selected cell transistors MT failing in the verification than in the normal single level write mode. Error correction capability by the ECC circuit 250 in the evacuation write can be set to be higher than error correction capability in the normal single level write mode by, for example, lowering the code rate.

The sequencer 14 can use, for the evacuation write, one, two or all of the start program voltage VpgmsL, an increment ΔVpgmL, and the reference value TN2. Which of those parameters are to be used can be determined by the sequencer 14 in advance and can be unchanged. As for those parameters for which a special value has not been designated for the evacuation write, the default value for the normal single level write mode is used.

Figure 22:
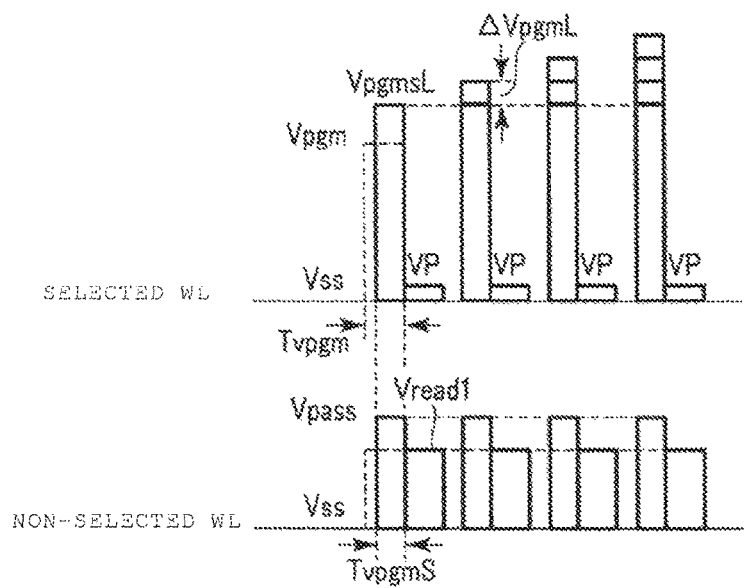
FIG. 22 is a diagram illustrating voltages applied to a word line during evacuation write in the first embodiment.

When one or both of the start program voltage VpgmsL and the increment ΔVpgmL for the evacuation write is used, the sequencer 14, as illustrated in FIG. 22, can use a program voltage application time TvpgmS instead of a program voltage application time Tvpgm in the normal single level write mode. The program voltage application time TvpgmS in the evacuation write is shorter than the program voltage application time Tvpgm in the normal single level write mode.

Figure 23:
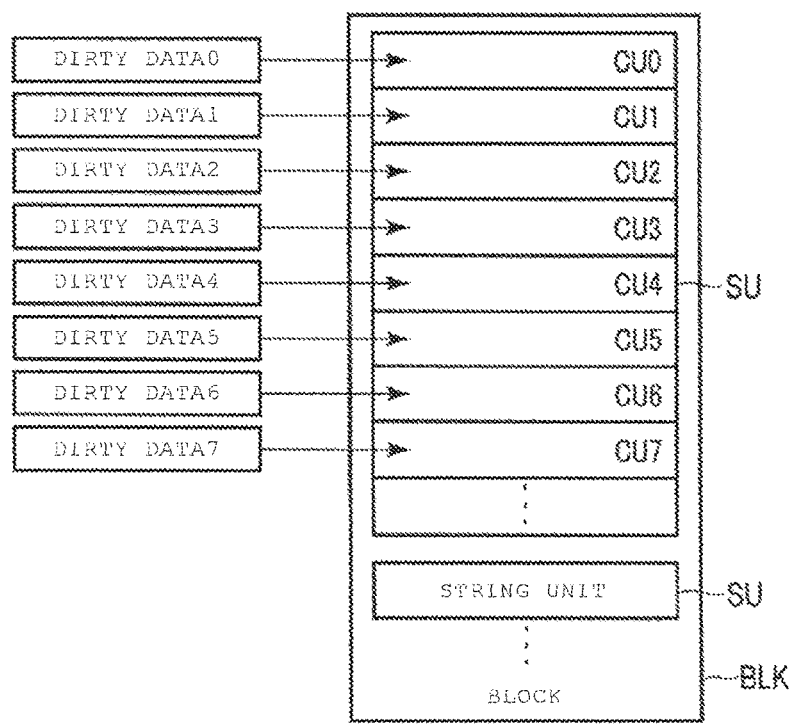
FIG. 23 is a diagram illustrating dirty data writing in evacuation write in the first embodiment.
Figure 24:
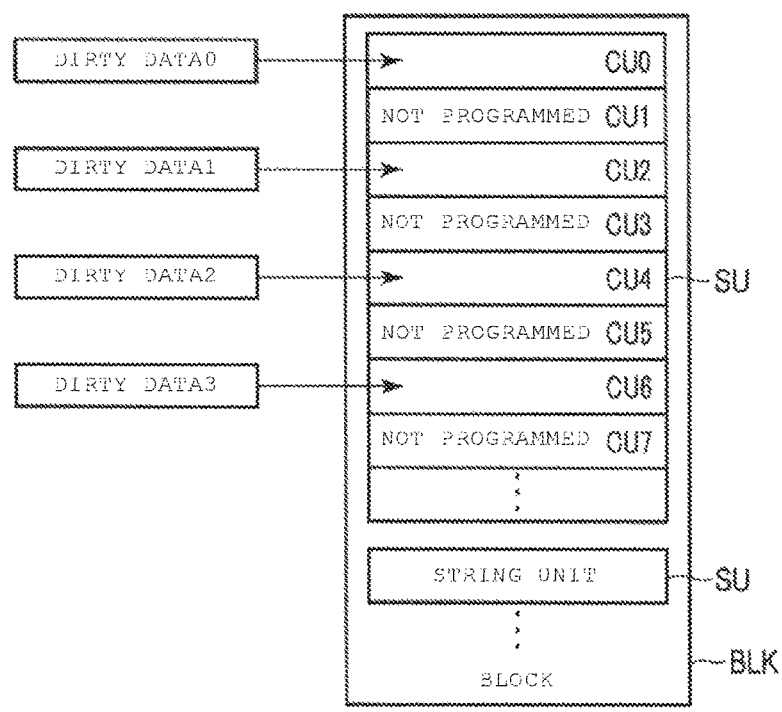
FIG. 24 is a diagram illustrating dirty data writing in evacuation write in the first embodiment.

The memory controller 200 repeats the evacuation write for writing the dirty data stored in the RAM 230 until all pieces of the dirty data are written into the nonvolatile memory 100. The memory controller 200, as illustrated in FIG. 23, writes the dirty data into a plurality of cell units CU of a block BLK in ascending order of an address of each cell unit CU without skipping any of the cell units CU. Alternatively, the memory controller 200 may write the dirty data into several cell units CU of a block BLK and does not write into remaining cell units CU of the block BLK. For example, as illustrated in FIG. 24, the memory controller 200 writes the dirty data into one cell unit CU of every two cell units (skipping one cell unit CU after programming one cell unit CU) in ascending order of addresses of the cell units CU. Specifically, the memory controller 200 writes the dirty data into the cell unit CU0 and subsequently, writes the dirty data into alternated cell units CU2, CU4, CU6, and . . . , skipping cell units CU1, CU3, CU5, and . . . . Alternatively, the memory controller 200 may write the dirty data into cell unit CU1 and subsequently, writes the dirty data into alternated cell units of each cell unit CU3, CU5, CU7, and . . . , skipping cell units CU0, CU2, CU4, and . . . . Further, a single cell unit CU may be used for every two cell units CU or three or more cell units CU. In this manner, after programming one cell unit, one or more neighbor cell units are skipped for programming in order for mitigating intercell interference.

<1.2.4.2. Evacuation Write by Setting Ordinary Parameter>

The nonvolatile memory 100 uses a standard value (setting), which is determined in advance, for a parameter (voltage or the like) related to an operation in various operations. Specifically, the sequencer 14 uses the start program voltage Vpgms having a default value, the increment ΔVpgm1, the read pass voltage Vread2, and the program voltage application time Tvpgm in the multiple-level write and the single level write. However, the sequencer 14 can change the value for the parameter.

Figure 25:
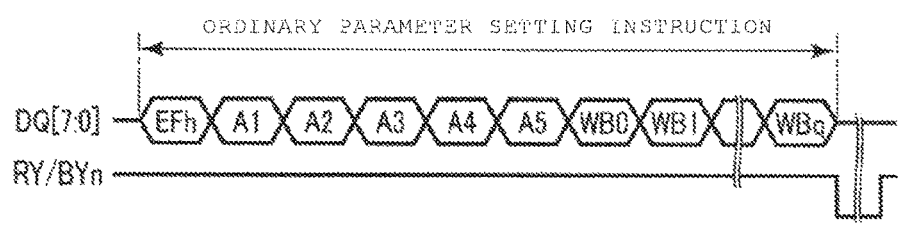
FIG. 25 is a diagram illustrating a flow of a signal for changing an ordinary parameter in the first embodiment.

FIG. 25 illustrates an example of a signal DQ input to the nonvolatile memory 100 from the memory controller 200 for transmitting the instruction of setting parameters. The nonvolatile memory 100 recognizes the ordinary parameter setting instruction illustrated in FIG. 25. The memory controller 200 sets the value of the ordinary parameter using the ordinary parameter setting instruction.

The ordinary parameter setting instruction includes a command EFh, address signals A1 to A5 over 5 cycles, and data WB (WB0, WB1, . . . , and WBq (q is a natural number)). The address signals A1 to A5 designate a set of parameters. Data WB includes a value for setting. A certain address signal designates ID=0 and designates a set of parameters of which ID=0. Another ID=1 designates a set of other parameters.

When data WBq is received, the nonvolatile memory 100 sets a set of designated parameters to the designated value. The value which is set by the command Efh remains until the value is reset or the nonvolatile memory 100 is turned off.

Figure 26:
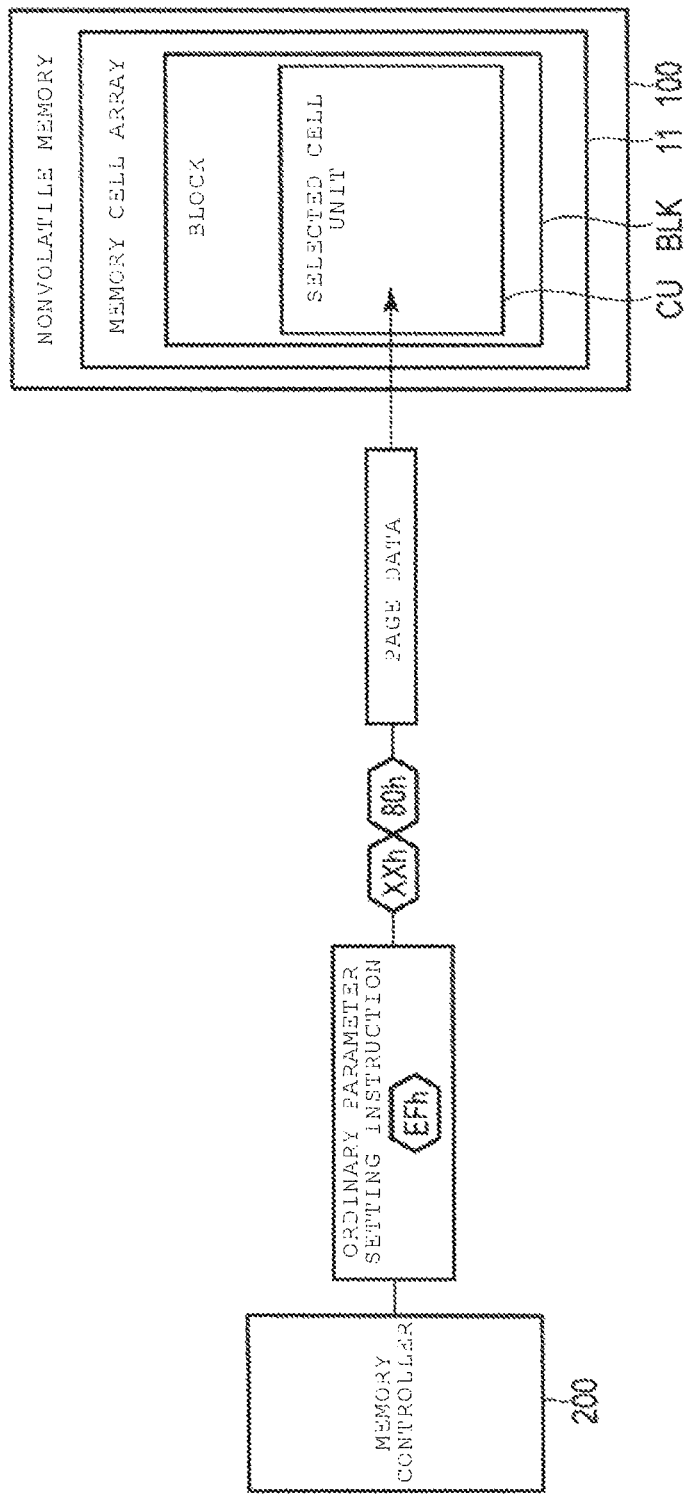
FIG. 26 is a diagram illustrating a flow of a signal in evacuation write in the first embodiment.

For the evacuation write, the memory controller 200, as illustrated in FIG. 26, transmits an ordinary parameter setting instruction to the nonvolatile memory 100 to set a related parameter and thereafter transmits the normal single level write instruction to the nonvolatile memory 100. The set parameters are the same as those described with reference to FIG. 20 to FIG. 22 and include the start program voltage Vpgms, the increment ΔVpgm1, and/or the program voltage application time Tvpgm. The normal single level write instruction instructs to write the dirty data into a cell unit CU in a block BLK in the SLC mode.

<1.2.4.3. Evacuation Write by Setting of Privileged Parameter>

A value of a privileged parameter of the nonvolatile memory 100 is able to be changed by a setting instruction of the privileged parameter. Some parameters, such as ordinary parameters, can be changed by the ordinary parameter setting instruction, but some other parameters, such as privileged parameters, cannot be changed by the ordinary parameter setting instruction. The privileged parameter setting instruction is able to change the values of the ordinary parameters, in addition to the values of the privileged parameters.

Figure 27:
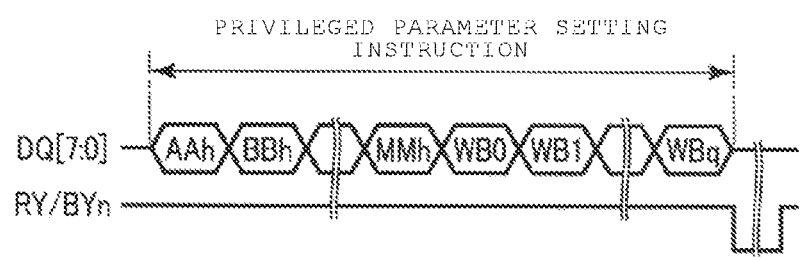
FIG. 27 is a diagram illustrating a flow of a signal for changing a parameter in the first embodiment.

FIG. 27 illustrates another example of a signal DQ input to the nonvolatile memory 100 from the memory controller 200 for transmitting an instruction of parameter setting. The nonvolatile memory 100 recognizes the privileged parameter setting instruction illustrated in FIG. 27. The memory controller 200 sets the value of the privileged parameter using the privileged parameter setting instruction.

The privileged parameter setting instruction includes, for example, a sequence of commands (AAh, BBh, . . . , and MMh) and data WB (WB0, WB1, . . . , and WBq). A specific sequence of commands designates a single parameter. When data WBq is received, the nonvolatile memory 100 sets the value for the designated parameter. The setting of the privileged parameters remains for a specific period of time and for example, remains for subsequent specific processing (for example, a series of writing).

Figure 28:
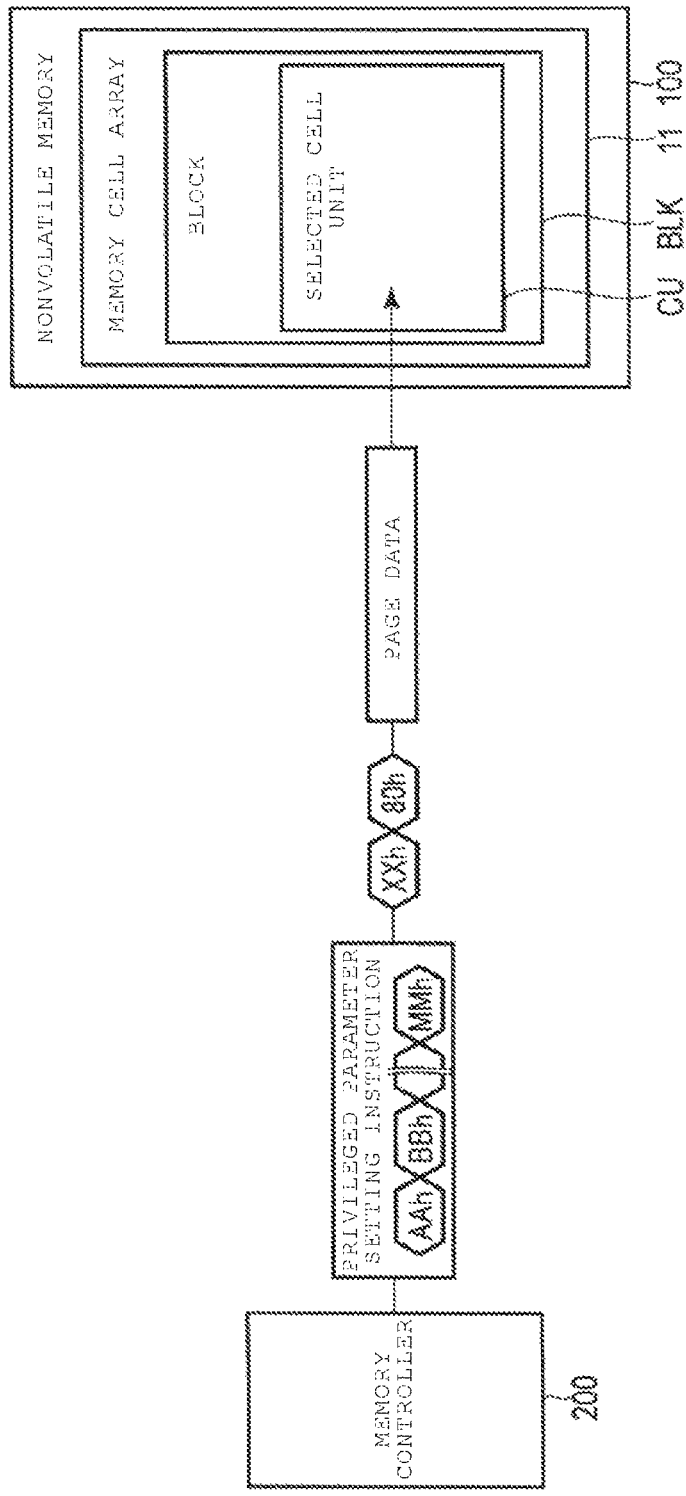
FIG. 28 is a diagram illustrating a flow of a signal in evacuation write in the first embodiment.

For the evacuation write, the memory controller 200, as illustrated in FIG. 28, transmits the privileged parameter setting instruction to the nonvolatile memory 100 to set the selected parameter and proceeds to transmit the normal single level write instruction to the nonvolatile memory 100.

The kinds of set parameters are the same as those described with reference to FIG. 20 to FIG. 22 and include the start program voltage Vpgms, the increment ΔVpgm1, and/or the program voltage application time Tvpgm. The normal single level write instruction instructs to write the dirty data into a cell unit CU in a block BLK in the SLC mode.

<1.2.4.4. Other Parameters>

Figure 29:
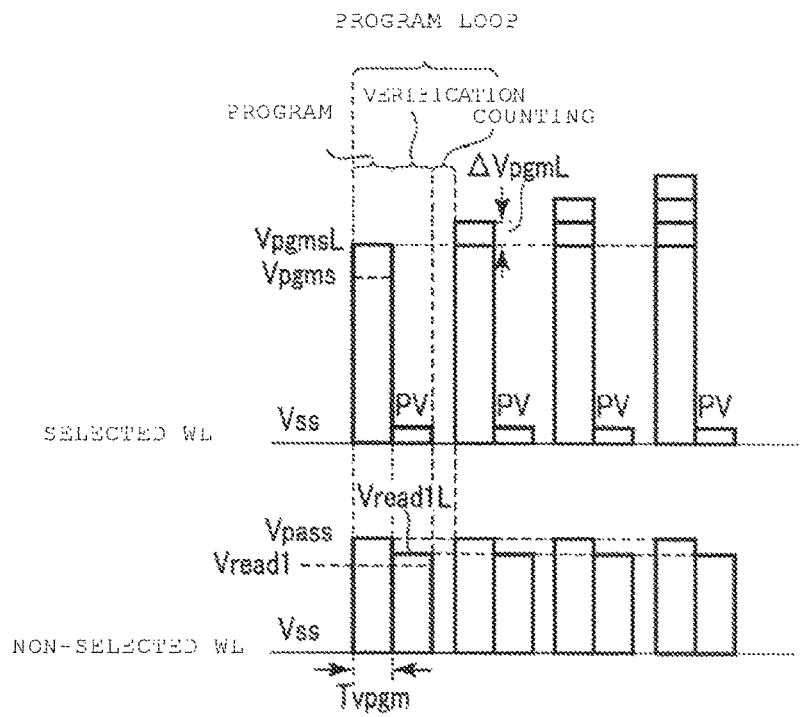
FIG. 29 is a diagram illustrating another example of voltages applied to a word line during evacuation write in the first embodiment.

In the evacuation write, there may be values (settings) of parameters other than the start program voltage VpgmsL, the increment ΔVpgmL, and the reference value TN2 that are different from the settings in the normal single level write mode. In particular, the sequencer 14, as illustrated in FIG. 29, can apply the read pass voltage Vread1L to the non-selected word line WL in addition to the use of at least the increment ΔVpgmL in the verification of the evacuation write. The read pass voltage Vread1L is greater than the read pass voltage Vread1. The read pass voltage Vread1L is greater than any of the threshold voltages of the cell transistors MT written by the evacuation write. The read pass voltage Vread1L is able to be determined in advance by defining of a distribution of the threshold voltages of the cell transistors MT programmed by the evacuation write, for example, by an experiment and/or simulation. Using the read pass voltage Vread1L can be instructed by the evacuation write instruction, or by a combination of setting of parameters and issuing the normal single level write instruction.

<1.3. Advantages (Effects)>

According to the first embodiment, the evacuation write is able to be completed in a shorter period of time. Details are as follows.

The evacuation write is able to be performed using the normal single level write instruction. In the normal single level write mode, a small increment ΔVpgm1 is used to minimize application of the voltage to the selected cell transistor MT. With this, wear of the selected cell transistor MT is reduced. On the other hand, the normal single level write mode might need more time to complete due to the use of the small increment ΔVpgm1. For that reason, the evacuation write using the normal single level write mode may not be completed within a period of time during which the power-supply voltage can be supplied by the backup power supply 310.

Accordingly, it is recognized that a capacitance of the backup power supply 310 should be increased, such that the evacuation write using the normal single level write mode is completed within a period of time during which the power-supply voltage can be supplied by the backup power supply 310. However, the backup power supply 310 having such a large capacitance occupies a large size in a mounting area and/or needs high cost. The amount of power needed for the evacuation write needs to be reduced in order to make it possible for the backup power supply having a low capacitance to be able to supply the amount of power needed for the evacuation write.

In the evacuation write, the amount of energy (integral of power w.r.t. time) consumed in the memory system 1 includes the amount of energy consumed by the memory controller 200 and the amount of energy consumed by the nonvolatile memory 100. The amount of energy consumed by the memory controller 200 is the product of power consumption of the memory controller 200 needed for completion of the evacuation write by the nonvolatile memory 100 and time needed for the completion of the evacuation write. On the other hand, the amount of energy consumed by the nonvolatile memory 100 is the product of power consumed by the nonvolatile memory 100 for the evacuation write and time needed for the completion of the evacuation write. As such, both of the amounts of energy are dependent on time and accordingly, time reduction of the evacuation write enables to reduce the capacitance of the backup power supply 310.

On the other hand, the evacuation write does not frequently occur. For that reason, although the evacuation write is a write causing the exhaustion of the cell transistor MT to increase, a possibility that the evacuation write significantly reduces the lifetime of the nonvolatile memory 100 is low.

In view of the matters described above, according to the first embodiment, the evacuation write is performed in the single level write and is performed by using parameter values (settings) different from the parameter values used in the normal single level write instruction. More specifically, the start program voltage VpgmsL, the increment ΔVpgmL, the reference value TN2, and/or the application time TvpgmS are used in the evacuation write. The start program voltage VpgmsL, the increment ΔVpgmL, and the reference value TN2 are respectively greater than the start program voltage Vpgms, the increment ΔVpgm, and the reference value TN1. The use of the start program voltage VpgmS increases the threshold voltage of the selected cell transistor MT in the first program loop greater than a case of using the start program voltage Vpgm. The use of the increment ΔVpgmL increases a value of the program voltage greater than a case of using the increment ΔVpgm. The use of the reference value TN2 relaxes the criteria of completion of the program than a case of using the reference value TN1. For that reason, due to the use of the start program voltage VpgmS, the increment ΔVpgmL, and/or the reference value TN2, the evacuation write is completed with the number of loops less than that of the normal single level write mode. For that reason, the evacuation write is completed using the number of program loops less than the number of program loops needed for the completion of the normal single level write mode, and is completed for a period of time shorter than the normal single level write mode. For that reason, the amount of energy needed for the completion of the evacuation write is less than that of the normal single level write mode and hence the necessary capacitance of the backup power supply 310 is less than that of the normal single level write mode.

Furthermore, the program voltage application time TvpgmS may be used in addition to the use of the start program voltage VpgmsL and the increment ΔVpgmL. The program voltage application time TvpgmS is shorter than the program voltage application time Tvpgm. For that reason, the use of the program voltage application time TvpgmS makes the time for program shorter than a case of the normal single level write mode and the time needed for the completion of the evacuation write is also shorter than a case of the normal single level write mode.

The power consumed in a single program loop in the nonvolatile memory 100 including a case where the start program voltage VpgmsL and/or the increment ΔVpgmL is used is substantially constant. This means that the use of the start program voltage VpgmsL and/or the increment ΔVpgmL reduces the number of program loops needed for the evacuation write, but the amount of energy consumption in a single program loop is not remarkably increased in compensation for the use.

When the evacuation write is completed using smaller number of program loops, it is possible to reduce a peak power of the memory system 1 in which a plurality of chips of the nonvolatile memory 100 are provided. The peak power of the memory system 1 depends on a sum of power consumptions of respective chip of nonvolatile memory 100 while the plurality of chips of nonvolatile memory 100 operate in parallel and the maximum peak power is easy to occur in the evacuation write process. In general, a low peak power is preferable. The operations of a plurality of the chips of nonvolatile memory 100 are temporally shifted (staggered) so as to make it possible to reduce the number of the chips of nonvolatile memory 100 operating in parallel at a time. However, when the time needed for the evacuation write is long, it is more difficult to reduce the peak amount of chips work in parallel such that all the dirty data is written into the nonvolatile memory 100 in the limited period of time. In the first embodiment, a short period of time for the evacuation write enables to temporally shift (stagger) operations of the plurality of the chips of nonvolatile memory 100 more easily and reduce the number of the chips of nonvolatile memory 100 operating in parallel at a time more easily.

Reduction of the peak power may improve the conversion efficiency of a DC-DC converter in the power supply control circuit 300 during the normal period, in which the power is supplied from the host device 2. In general, the current capacity of the power supply circuit is designed to afford the maximum load assumed during the operation. On the other hand, when a power supply circuit (in particular, the DC-DC converter) with a large current capacity drives a low load, conversion efficiency is poor. Accordingly, it is preferable that the load at a peak (in the evacuation mode) is not significantly different from the average load during the normal period. Power consumption of the nonvolatile memory 100 easily reaches the peak during the evacuation write. According to the first embodiment, the time for program is reduced so as to temporally shift (stagger) operations of the plurality of the chips of nonvolatile memory 100 to thereby reduce the number of the chips of nonvolatile memory 100 operating in parallel at a time. As a result, it is possible to reduce the peak power and improve the conversion efficiency of the DC-DC converter in certain cases other than the evacuation write, that is, during the normal period.

In the first embodiment, the memory controller 200 does not read a status about a result of the evacuation write after the evacuation write. In a case where the memory controller 200 is configured to perform reading of the status after the evacuation write, the backup power supply 310 needs to have a large capacitance in order to supply the amount of power needed for reading of the status. However, even when the status indicates a failure of the evacuation write, in general, retry writing is omitted due to limitation of the capacity of the backup power supply 310. Instead, the dirty data are recovered by the product code or a replicated portion in the nonvolatile memory 100 upon restarting. Accordingly, reading of status is of no use to subsequent processing after that and for that reason, it is possible to omit reading of status. This omission enables a required capacitance of the backup power supply 310 to be smaller than a case where reading of status is performed.

The memory controller 200 writes dirty data into a single cell unit CU and skips programming one or more cell units CU among every plurality of cell units CU. This alternate writing of dirty data relaxes interference on the data, which is written into a certain cell unit CU by being subjected to the evacuation write, by the raised threshold voltage of the cell unit CU which is adjacent to or positioned both sides of the certain cell unit CU so that the data subjected to the evacuation write is held with high reliability. In particular, employing of this alternate writing manner in the evacuation write is useful, because the data subjected to the evacuation write has possibly lower reliability than data written by the normal single level write mode, due to the parameter values different from the ones in the normal single level write mode.

Instead of utilizing the high efficiency of the evacuation write of the first embodiment for reducing the required capacitance of the backup power supply 310, it can be utilized for enlarging the maximum amount of dirty data with the required capacitance remaining the same. By doing this, the RAM 230 is able to hold a larger amount of dirty data even for the backup power supply 310 in which the capacitance remains same. The memory controller 200 may perform grouping pieces of write data into a plurality of units each of which is called a stream and managing and writing in units of a stream in order to reduce the write amplification factor. Matters that the RAM 230 is able to hold a larger amount of dirty data when such processing is performed enable more streams to be supported.

The following advantages may be obtained by using read pass voltage Vread1L. In general, a finer threshold voltage distribution (level) of the cell transistors immediately after writing is desirable for a larger reading margin and hence an increase of the threshold voltage at the time of program loop is preferably small in order to obtain such a distribution. The threshold voltage of the cell transistor MT is increased by application of voltage to the word line WL at the time of program loop. In order to prevent an undesired increase of a threshold voltage of the cell transistor MT (disturbance to cell transistor MT) due to the voltage applied to the non-selected word line WL when verification is performed, the voltage applied to the non-selected word line WL is preferred to be as low as possible. On the other hand, the use of an increment $\Delta$VpgmL in the evacuation write is able to increase the threshold voltage of selected cell transistor MT for each program loop to be greater than a case where an increment $\Delta$Vpgm is used in the normal single level write mode. For the evacuation write, completing the evacuation write in a short period of time is given priority and generation of the finer distribution as in the case of the normal single level write mode is not a priority. Accordingly, the advantage in employing the low read pass voltage Vread1 as in the verification of the normal single level write mode, is small in the evacuation write. By using the read pass voltage Vread1L, it is possible to increase a reading margin from the cell transistor MT subjected to the evacuation write. This is because it is possible to make spacing between the P state and the read pass voltage Vread1L sufficiently large. The use of read pass voltage Vread1L does not result in any meaningful disadvantages. This is because although the application of the read pass voltage Vread1L may cause a disturbance larger than a case of application of the read pass voltage Vread1 in the normal single level write mode, reading of data subjected to the evacuation write occurs once at the time of the start and accordingly an error rate in read data caused by applying the read pass voltage Vread1L does not grow considerably high.

Second Embodiment

A second embodiment is related to details of the evacuation write.

The memory system 1, the memory controller 200, and the nonvolatile memory 100 of the second embodiment are configured in the same manner as the first embodiment. In the second embodiment, the memory controller 200 and the nonvolatile memory 100 are configured to perform operations described in the following.

<2.1. Operation>

When an evacuation write instruction illustrated in FIG. 18 is received, the nonvolatile memory 100 performs operations described as follows. However, the memory controller 200 may instruct the evacuation write described in the following by an instruction different from that shown in FIG. 18. In such a case, the instruction is different from the instruction of FIG. 18 in, for example, a command preceding a write command. The memory controller 200 transmits a command ZZh instead of, for example, the command YYh.

Figure 30:
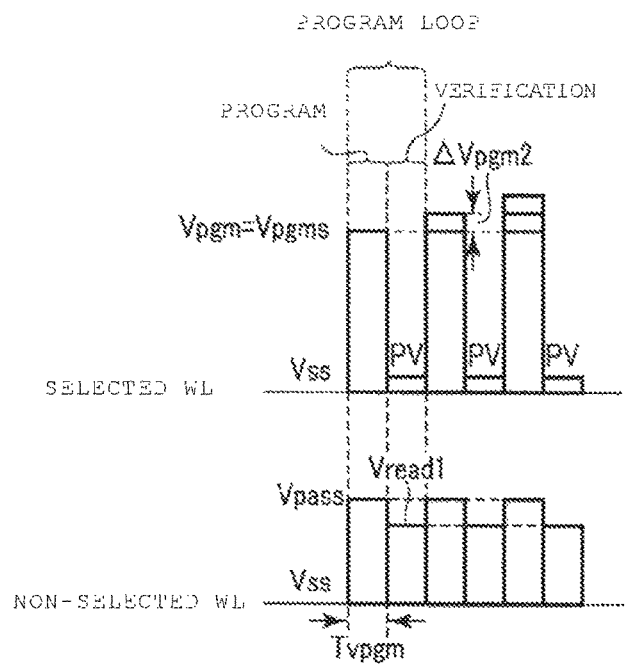
FIG. 30 is a diagram illustrating voltages applied to a word line during evacuation write in a second embodiment.

The evacuation write of the second embodiment is different from the normal single level write mode, and the sequencer 14, as illustrated in FIG. 30, does not perform counting of fail bits in each program loop. Furthermore, the sequencer 14 performs the program loops for a fixed number of times with respect to one process of evacuation write, that is, with respect to a single evacuation write instruction.

Fail bits are not counted and thus, whether programming is completed without fail is not determined. For that reason, a result of counting of fail bits needed for determining to execute the next program loop is not obtained. Accordingly, the determination of execution of the next program loop is not made and program loops are performed a certain fixed number of times as a result. The fixed number of times of program loops is able to be determined by experiment and/or simulation as, for example, an average number of times or the maximum number of times of program loops performed until the normal single level write is completed. The sequencer 14 performs the program loops for this fixed number of times over a plurality of evacuation write processes, in particular, all of evacuation writes.

The sequencer 14 may additionally use several features of the evacuation write of the first embodiment. That is, the sequencer 14 may use the start program voltage VpgmsL and/or an increment ΔVpgmL.

Figure 31:
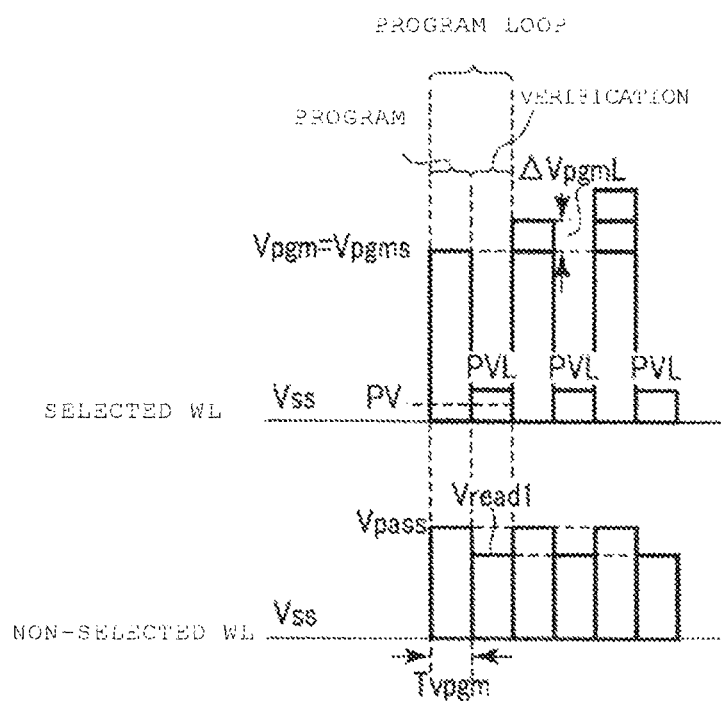
FIG. 31 is a diagram illustrating another example of voltages applied to a word line during evacuation write in the second embodiment.

The sequencer 14 is, as illustrated in FIG. 31, may use the increment ΔVpgmL and apply the voltage PVL, instead of the voltage PV to the selected word line WL in the verification of the evacuation write. The voltage PVL is higher than the voltage PV.

As in the first embodiment, the evacuation write may be realized by a combination of setting of parameters and issuing the normal single level write instruction. That is, the sequencer 14 transmits an ordinary parameter setting instruction or a privileged parameter setting instruction to the nonvolatile memory 100 indicating that counting of fail bits not to be executed and execution of a fixed number of times of program loops in a single level write instruction.

<2.2. Effects>

The evacuation write of the second embodiment does not include counting of fail bits. For that reason, the evacuation write is completed in a period of time shorter than the normal single level write mode. Accordingly, as is the case in the first embodiment, the capacitance needed for the backup power supply 310 is smaller than a case of the normal single level write mode using parameters with standard settings (standard values).

By using the voltage PVL, the P state due to the evacuation write has spacing between the P state and the Er state larger than a case where the voltage PV is used, so that a high reading margin may be achieved for the cell transistor MT subjected to the evacuation write.

Third Embodiment

A third embodiment is related to details of the evacuation write.

The memory system 1, the memory controller 200, and the nonvolatile memory 100 of the third embodiment have the same elements and connections as those of the first embodiment. In the third embodiment, the memory controller 200 and the nonvolatile memory 100 are configured to perform operations described in the following.

<3.1. Operation>

When an evacuation write instruction illustrated in FIG. 18 is received, the nonvolatile memory 100 performs operations described in the following. The memory controller 200 may also instruct the evacuation write described in the following by an instruction other than that shown in FIG. 18. In this case, the instruction is different from the instruction of FIG. 18 in, for example, a command preceding a write command. The memory controller 200 transmits a command TTh instead of, for example, the command YYh.

Figure 32:
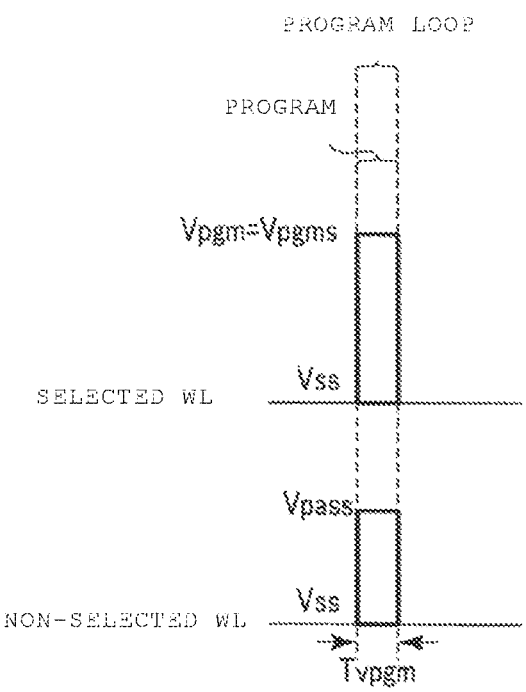
FIG. 32 is a diagram illustrating voltages applied to a word line during evacuation write in a third embodiment.
Figure 33:
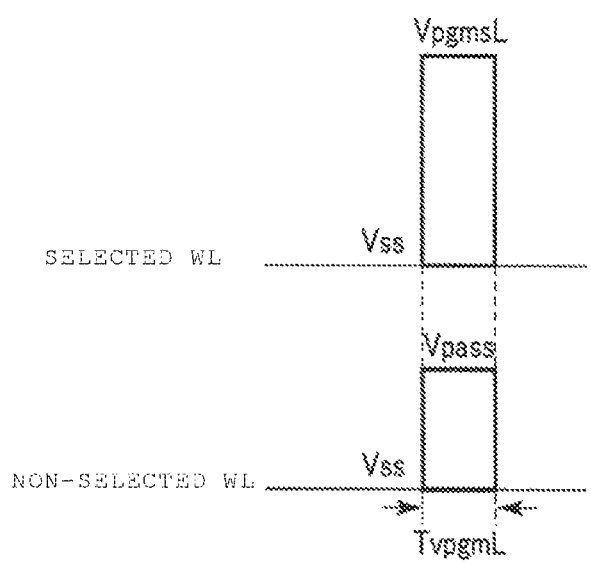
FIG. 33 is a diagram illustrating voltages applied to a word line during evacuation write in the third embodiment.

The evacuation write of the third embodiment is different from the normal single level write mode and the sequencer 14, as illustrated in FIG. 32, performs only the program once in response to the evacuation write instruction. The sequencer 14 does not perform the verification, counting of fail bits, or the second program loop and succeeding program loops. Otherwise, as illustrated in FIG. 33, the sequencer 14 may use the start program voltage VpgmsL and/or program voltage application time TvpgmL, instead of the program voltage application time Tvpgm, such that program is completed by only single application of a program voltage. The program voltage application time TvpgmL in the evacuation write is longer than the program voltage application time Tvpgm in the normal single level write mode.

As in the first embodiment, the evacuation write may be realized by a combination of setting of parameters and issuing the normal single level write instruction. That is, the sequencer 14 transmits an ordinary parameter setting instruction or a privileged parameter setting instruction to the nonvolatile memory 100 indicating that verification and counting of fail bits not to be executed and a single execution of program loop to be executed.

Figure 34:
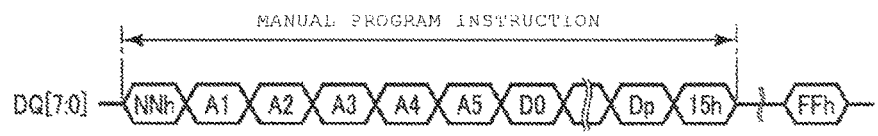
FIG. 34 is a diagram illustrating an example of a signal DQ for transmitting an instruction of normal single level write in the third embodiment.

Furthermore, the evacuation write may be performed by using the command instructing application of program voltage Vpgm in combination with the reset command. The memory controller 200 transmits commands as illustrated in FIG. 34 for the evacuation write. FIG. 34 illustrates an example of a signal DQ input to the nonvolatile memory 100 from the memory controller 200 for transmitting an instruction of the evacuation write.

As illustrated in FIG. 34, the memory controller 200 performs the program by using manual program instruction. The manual program instruction includes a manual program command NNh, address signals A1 to A5, write data D0 to Dp, and an execution command 15h. The nonvolatile memory 100 recognizes the manual program instruction and when the manual program instruction is received, performs the program, continues applying the program voltage (Vpgms or VpgmsL) to the selected word line WL. The continuation time of the program voltage by the manual program instruction is not predetermined and application of the program voltage continues until the manual program instruction is stopped in some way.

After that, the memory controller 200 transmits the reset command FFh to the nonvolatile memory 100. When the reset command FFh is received, the nonvolatile memory 100 stops a process in progress, that is, the program in the current example. The continuation time of the program is determined by a period of time ranging from the time at which the command 15h is received to the time at which the reset command FFh is received. The memory controller 200, for example, transmits the reset command FFh at the timing selected such that the program is performed over a predetermined period of time.

<3.2. Effects>

The evacuation write of the third embodiment includes only program performed once. For that reason, the evacuation write is completed in a period of time shorter than the normal single level write mode. Accordingly, it is the same as the first embodiment and the capacitance needed for the backup power supply 310 is smaller than a case of the normal single level write mode using the parameters having standard values.

Fourth Embodiment

A fourth embodiment is related to details of the evacuation write and is used in addition to the first to third embodiment, in particular, to the second or to the third embodiment.

The memory system 1, the memory controller 200, and the nonvolatile memory 100 of the fourth embodiment have the same elements and connections as those of the first embodiment. In the fourth embodiment, the memory controller 200 and the nonvolatile memory 100 are configured to perform operations described in the following.

<4.1. Operation>

Figure 35:
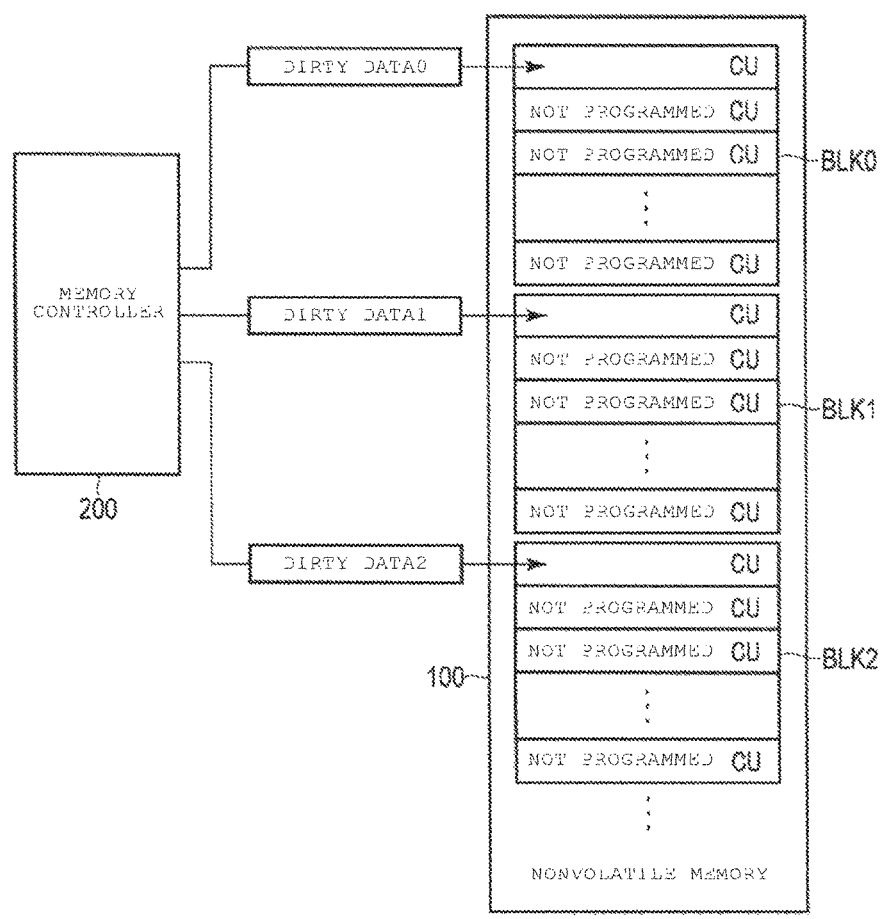
FIG. 35 is a diagram illustrating data writing in evacuation write in a fourth embodiment.

As illustrated in FIG. 35, in the evacuation write, the memory controller 200 instructs the nonvolatile memory 100 such that at most one cell unit CU in a single string unit SU of a single block BLK to be programmed. The memory controller 200 does not designate remaining cell units CU in the string unit as the writing destination in the subsequent evacuation write instruction. Among cell units CU in a single string unit SU, any single cell unit CU may be selected.

Further, the memory controller 200 may write the dirty data only into a single string unit SU among string units SU in a single block BLK in the evacuation write.

Figure 36:
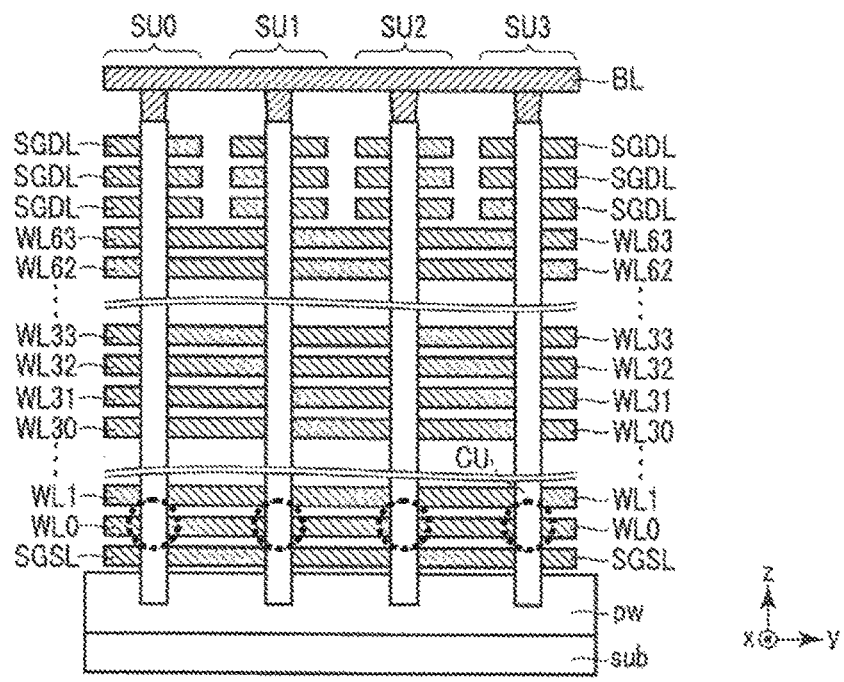
FIG. 36 is a diagram illustrating a first example of a data writing destination in evacuation write in the fourth embodiment.

The memory controller 200 may write the dirty data into a plurality of cell units CU of a single block BLK each of which is connected to a same word line WL and belongs to different string unit SU from each other. FIG. 36 illustrates such an example. FIG. 36 illustrates an example which is different from the example of FIG. 4 and in which 64 conductors CW (word line WL) are provided. FIG. 36 illustrates writing of data into the cell unit CU connected to the word line WL0 as an example. A word line WL which data is written into is not limited to the word line WL0, but may be any other word line WL.

Figure 37:
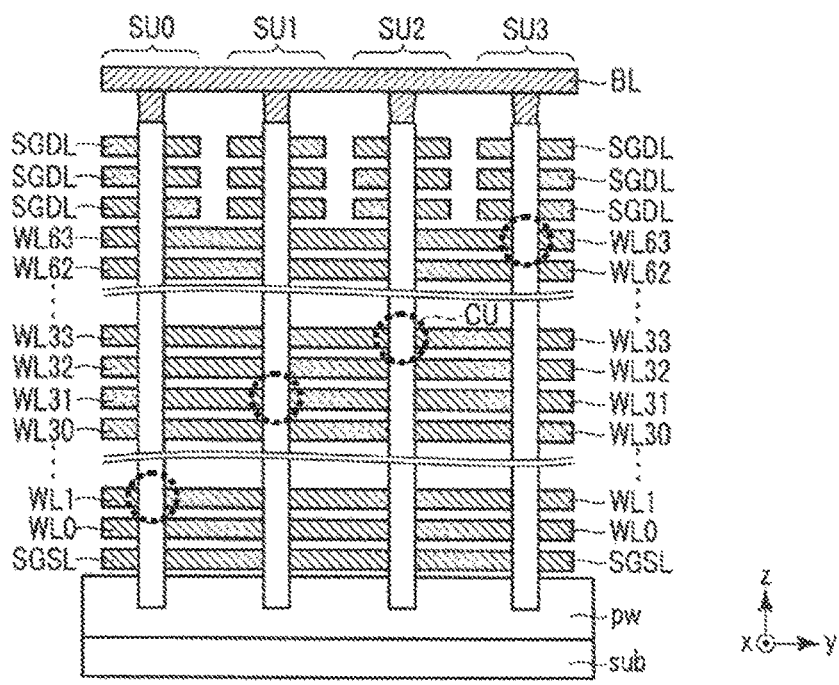
FIG. 37 is a diagram illustrating a third example of a data writing destination in evacuation write in the fourth embodiment.

Alternatively, the memory controller 200 may write the dirty data into a plurality of cell units CU of a single block BLK each of which is connected to a different word line WL and belongs to different string unit SU from each other. FIG. 37 illustrates such an example. FIG. 37 illustrates an example which is different from the example of FIG. 4 and in which 64 conductors CW (word line WL) are provided. FIG. 37 illustrates, as an example, writing of data into the cell units CU connected respectively to the word lines WL1, WL31, WL33, and WL63 in the string units SU0, SU1, SU2, and SU3. Data may be written into a different set of cell units CU.

The cell unit CU in which the dirty data is to be written may be selected based on, data retention characteristics of the cell unit CU. In the cell array 11 having the structure of FIG. 4, cell transistors MT positioned at different coordinates, (that is, height from substrate sub) on the z-axis may have different data retention characteristics. Accordingly, the dirty data may be written into the cell unit CU positioned at a height having high data retention characteristics.

Figure 38:
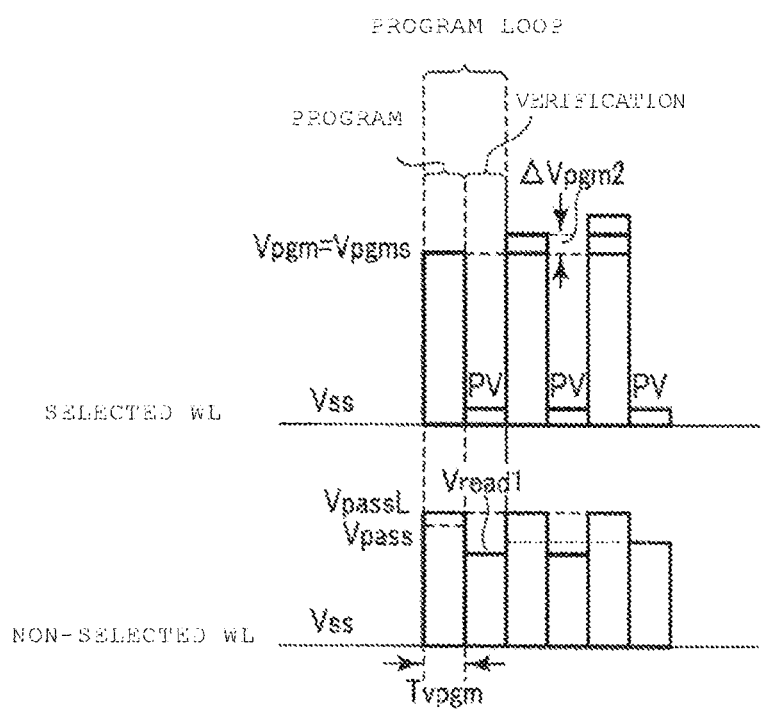
FIG. 38 is a diagram illustrating voltages applied to a word line during evacuation write in the fourth embodiment.

Furthermore, sequencer 14, as illustrated in FIG. 38, may apply the program pass voltage VpassL to the non-selected word line WL, instead of the voltage Vpass, in the program of the evacuation write. The voltage VpassL is higher than the voltage Vpass. FIG. 38 illustrates a case of a combination of the fourth embodiment and the second embodiment.

<4.2. Advantage>

In the second and third embodiment, the evacuation write includes application of the program voltage once or a plurality of fixed times and does not include verification including determination of whether to proceed to the next program loop based on the verification result. For that reason, a selected transistor MT for which a threshold voltage is increased by the evacuation write may be overprogrammed, i.e., have an excessive threshold voltage. In particular, when a threshold voltage of the selected cell transistor MT subjected to the programming exceeds the read pass voltage Vread1, data programmed in another cell transistor MT belonging to the string STR to which the selected transistor MT belongs is unable to be read. This is because the cell transistor MT having the threshold voltage of which magnitude exceeds the read pass voltage Vread1 is not turned on even when the read pass voltage Vread1 is applied in the connected word line WL and accordingly, the state of remaining cell transistors MT is unable to be determined.

According to the fourth embodiment, the memory controller 200 writes the dirty data into only a single cell unit CU per a single string unit SU in the evacuation write. Accordingly, data will not be read from another cell unit CU in the string unit SU that includes the cell unit CU in which the dirty data is written. Accordingly, even when the cell unit CU in which data is written includes the cell transistor MT of which the threshold voltage exceeds the read pass voltage Vread1, reading operations in the nonvolatile memory are not affected.

The use of the fourth embodiment may limit usable capacity of a block BLK. On the other hand, after the evacuation write, like Step S9 of FIG. 9, when the memory system 1 is started, data is read from the evacuation block BLKb and the read data is written into another block BLK (relocating). An evacuation block BLKb from which data is moved to another block BLK becomes available as a write destination again. For that reason, capacity reduction of the block BLK is not caused by the evacuation write of the fourth embodiment.

For example, in the string units SU physically adjacent to each other as illustrated in FIG. 37, the dirty data is written into the cell units CU having different addresses such that data is not written into a cell unit CU adjacent to a cell unit CU into which another data is written. As such, it is possible to avoid the cell units CU into which data is written from interfering each other. Specifically, the cell transistor MT into which data is programmed to be the P state in the evacuation write may have a threshold voltage greater than that of the cell transistor MT into which data is programmed to be the P state at a normal mode. For that reason, the threshold voltage of the cell transistor MT in the Er state may be significantly different from the threshold voltage of the cell transistor MT belonging to the P state due to the parameter setting of the evacuation write. Accordingly, in two cell units CU into which data is written, when the cell transistor MT belonging to the Er state is adjacent to the cell transistor MT belonging to the P state by the evacuation write, the threshold voltage of the cell transistor MT in the Er state may be increased by the adjacent cell transistor MT in the P state. Such a situation can be avoided by writing as illustrated in FIG. 37.

The following advantages may be obtained by using the program pass voltage VpassL. As described above, the program pass voltage Vpass has the magnitude capable of raising the channel by coupling to a degree that an increase of threshold voltage in the selected cell transistor MT can be prevented in the program inhibited string STR while preventing an increase of the threshold voltage of a non-selected cell transistor MT in the programmable string STR. The program pass voltage Vpass is preferably high in order to prevent the increase of the threshold voltage of the selected cell transistor MT in the program inhibited string STR. On the other hand, the program pass voltage Vpass is preferably low in order to prevent the increase of the threshold voltage of the non-selected cell transistor MT in the programmable string STR. In contrast, in the fourth embodiment, the dirty data is written into only a single cell unit CU per a single string unit SU and accordingly, data is not read from remaining cell units CU. For that reason, unintended increase of the threshold voltages of the cell transistors MT of remaining cell units CU does not need to be prevented. The use of program pass voltage VpassL is able to more strongly prevent the increase of the threshold voltage of the selected cell transistor MT in the program inhibited string STR than in a case where the program pass voltage Vpass is used. That is, it is possible to further suppress undesired programming of the selected cell transistor MT in the program inhibited string STR.

Fifth Embodiment

A fifth embodiment is related to details of Step S9 of FIG. 9 in reading data from the evacuation block and is used in addition to the first to third embodiment, in particular, to the second or to the third embodiment.

The memory system 1, the memory controller 200, and the nonvolatile memory 100 of the fifth embodiment have the same elements and connections as those of the first embodiment. On the other hand, in the fifth embodiment, the memory controller 200 and the nonvolatile memory 100 are configured to perform operations described in the following.

<5.1. Operation>

Figure 39:
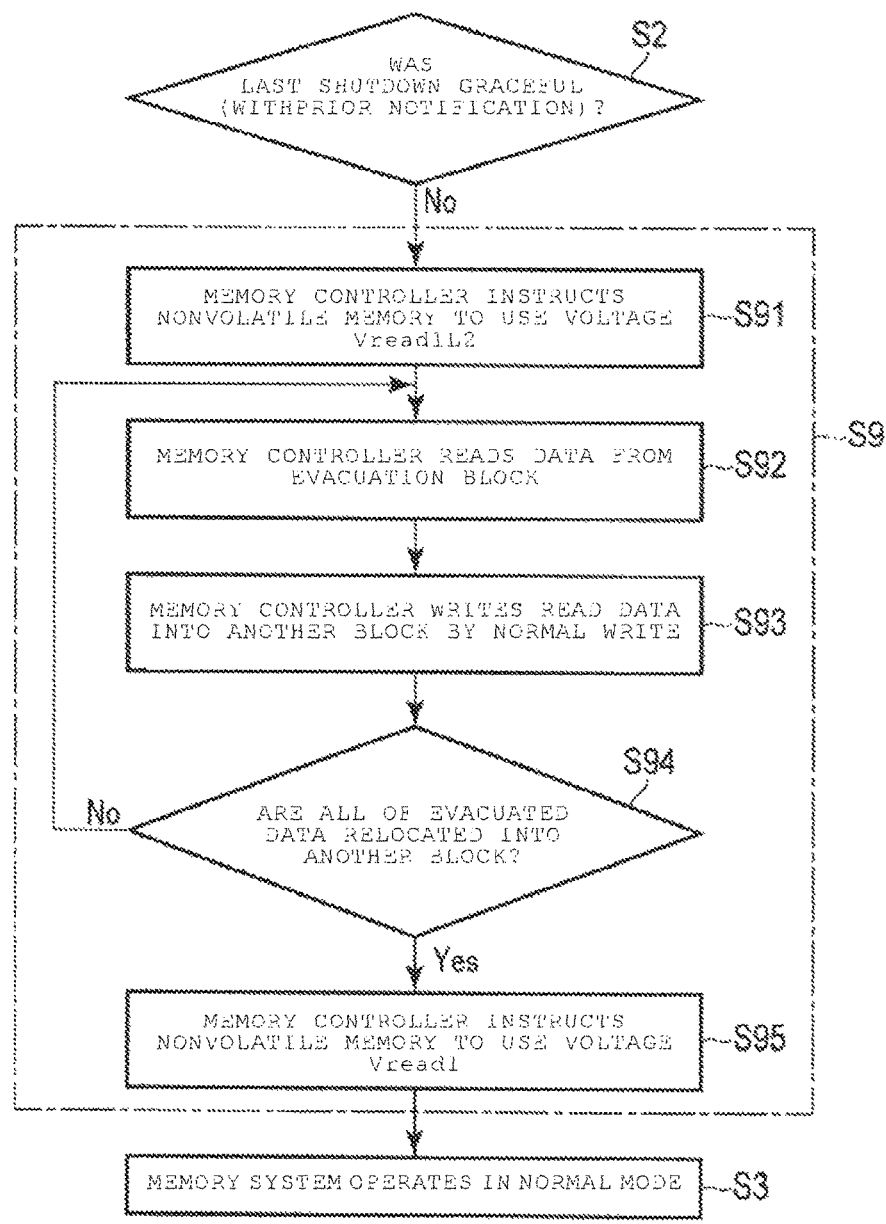
FIG. 39 is a flowchart illustrating a restart process in the memory system in a fifth embodiment.
Figure 40:
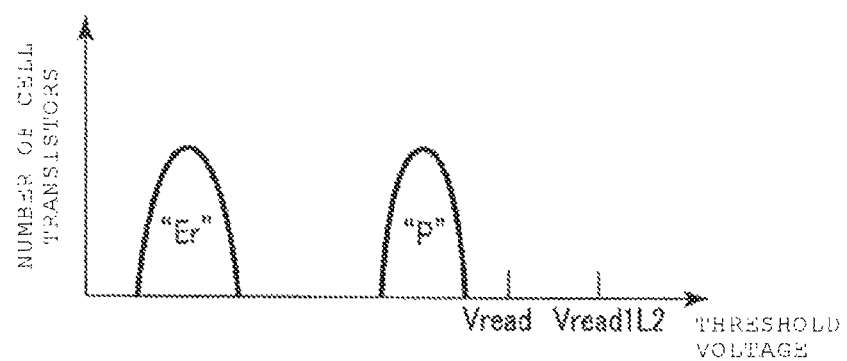
FIG. 40 is a diagram illustrating voltages applied to a non-selected word line in the restart process in the fifth embodiment.

FIG. 39 illustrates a process of a memory system of the fifth embodiment and illustrates a detailed process of Step S9 of FIG. 9. As illustrated in FIG. 39, the memory controller 200 instructs the nonvolatile memory 100 to use the read pass voltage Vread1L2, instead of using the read pass voltage Vread1 (Step S91), after the determination of "No" in Step S2. The read pass voltage Vread1L2 a fixed value is greater than the read pass voltage Vread1, and as illustrated in FIG. 40, is sufficiently greater than any of the threshold voltages of the cell transistors MT into which data is programmed by the evacuation write. The read pass voltage Vread1L2 may be determined in advance through calculation of a distribution of the threshold voltages of the cell transistors MT into which data is written, for example, by experiment and/or simulation. The read pass voltage Vread1L2 may also be equal to the read pass voltage VreadL.

The instruction to the nonvolatile memory 100 to use read pass voltage Vread1L2 may be performed by using the ordinary parameter setting instruction (see FIG. 25) and/or the privileged parameter setting instruction (see FIG. 27).

Description will be referred back to FIG. 39. The memory controller 200 transmits a normal read instruction to the nonvolatile memory 100 and reads data from the evacuation block BLKb (Step S92). The read instruction includes designation of a cell unit CU holding data written by the evacuation write. The nonvolatile memory 100 reads data from the cell unit (selected cell unit) CU which is a designated reading target in response to the read instruction. In reading, the sequencer 14 performs applying the voltage Vsg to the selection gate lines SGDL and SGSL of the selected string unit SU included in the selected cell unit CU, applying the read voltage VP to the selected word line WL, and applying the read pass voltage Vread1L2 to the non-selected word lines WL.

The memory controller 200 receives the memory read data read from the cell unit CU from the nonvolatile memory 100 and attempts to perform error correction using parity data in the received memory read data. When an error in the memory read data from a certain single selected cell unit CU is not corrected, the memory controller 200 attempts to perform error correction again using the product code. That is, the memory controller 200 uses apiece of memory read data having an error that was uncorrectable and other memory read data for which the product code is generated and attempts to correct the memory read data having an error that was uncorrectable. Alternatively, as described in the first embodiment, in a case where replicated copies of write data are written into a plurality of cell units CU, when the memory controller 200 failed in correcting an error in a copy of the piece of write data, the memory controller 200 reads memory read data from another cell unit CU in which another copy of write data is held, and attempts to perform error correction.

The memory controller 200 writes the piece of memory read data for which an error has been corrected into another block BLK by the normal write (Step S93). The memory controller 200 determines whether all pieces of data subjected to the evacuation write, that is, all pieces of data in the evacuation block BLKb, are written (relocated) into another block BLK through execution of Steps S92 and S93 (Step S94).

When the evacuation block BLKb includes apiece of data which is not written into the other block BLK (No Branch), the process returns to Step S92. When the evacuation block BLKb does not include a piece of data which is not written into the other block BLK (Yes Branch), the process makes transition to Step S95. In Step S95, the memory controller 200 instructs the nonvolatile memory 100 to use the read pass voltage Vread1 instead of using the read pass voltage Vread1L2. Step S95 continues to Step S3.

<5.2. Advantage>

As described in the fourth embodiment, in particular, in the second or the third embodiment, the cell transistor MT which is a target of the evacuation write may be over-programmed and have a threshold voltage exceeding the read pass voltage Vread1. This may prevent data from being properly read from another cell transistor MT included in the string STR in which the cell transistor MT having a threshold voltage exceeding the read pass voltage Vread1.

According to the fifth embodiment, after the restart of the memory system 1, the memory controller 200 instructs the nonvolatile memory 100 to use the read pass voltage Vread1L2 instead of using Vread1 to the non-selected word line WL. The memory controller 200 relocates data in the evacuation block BLKb into another block BLK in a mode at which the use of read pass voltage Vread1L2 is designated. The read pass voltage Vread1L2 is greater than the threshold voltage of any of cell transistors MT which are targets of the evacuation write. Accordingly, for example, even when a certain cell transistor MT has a threshold voltage exceeding the read pass voltage Vread1, the cell transistor MT is turned on when the read pass voltage Vread1L2 is applied to the gate of the cell transistor MT. This enables reading from a string STR including the cell transistors MT having the threshold voltage exceeding the read pass voltage Vread1, as long as the threshold voltage is lower than the read pass voltage Vread1L2.

Application of the read pass voltage Vread1L2 to the non-selected word line WL may cause a disturbance greater than a case of application of the read pass voltage Vread1 and the disturbance may change data held by these cell transistors MT. However, reading of data written by the evacuation write occurs only at a low frequency upon restarting of the memory system 1. For that reason, the disturbance is not great enough to change the read data by application of the read pass voltage Vread1L2.

While certain embodiments have been described these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The embodiments and modifications thereof fall within matters set forth in the claims and their equivalents as would fall within the scope and spirit of the invention.

What is claimed is:

1. A memory system comprising:
   a nonvolatile memory including a plurality of memory cells and a plurality of word lines;
   a controller configured to control the nonvolatile memory; and
   a backup power supply,
   wherein, in response to a detection that power from an external source to the memory system is interrupted, at which time power to the memory system starts to be supplied from the backup power supply, the controller:
      transmits a first command to the nonvolatile memory to change a parameter for a write operation on first memory cells, which are electrically connected to a first word line and are in an erased state; and then
      transmits a second command to the nonvolatile memory to carry out the write operation on the first memory cells, such that the nonvolatile memory carries out the write operation using the changed parameter.

2. The memory system according to claim 1, wherein the write operation performed on the first memory cells in the erased state using an unchanged parameter takes a first completion time and the write operation performed on the first memory cells in the erased state using the changed parameter takes a second completion time that is shorter than the first completion time.

3. The memory system according to claim 1, wherein changing the parameter includes increasing a start program voltage.

4. The memory system according to claim 1, wherein changing the parameter includes increasing an incremental program voltage that is added to a program voltage after completion of a program loop.

5. The memory system according to claim 1, wherein changing the parameter includes decreasing a program voltage application time.

6. The memory system according to claim 1, wherein changing the parameter includes increasing a verification voltage.

7. The memory system according to claim 1, wherein upon a restoration of the power supplied to the memory system from the external source after the detection, the controller transmits a third command to carry out a read operation with a read pass voltage that is higher than a read pass voltage with which a read operation is carried out before the detection, the read pass voltage being a voltage applied to a word line that is not a read target word line.

8. The memory system according to claim 1, wherein changing the parameter causes the nonvolatile memory to carry out the write operation without any verification.

9. The memory system according to claim 1, wherein changing the parameter causes the nonvolatile memory to carry out the write operation without any counting of fail bits.

10. The memory system according to claim 9, wherein changing the parameter causes the nonvolatile memory to carry out the write operation in a fixed number of program loops.

11. The memory system according to claim 1, wherein prior to the detection, the controller transmits a third command to the nonvolatile memory to return a status of the write operation after the controller transmits the second command to the nonvolatile memory to carry out the write operation, and
in response to the detection, the controller does not transmit the third command to the nonvolatile memory after the controller transmits the second command to the nonvolatile memory.

12. The memory system according to claim 1, wherein the second command includes a plurality of write commands, and the controller, in response to the detection, transmits the plurality of write commands to the nonvolatile memory as the second command, each of the plurality of write commands identifying a cell unit of the nonvolatile memory in which respective data of the plurality of write commands are to be written, the cell unit being a set of memory cells sharing a same word line within a string unit.

13. The memory system according to claim 12, wherein the cell units in which respective data of the plurality of write commands are to be written, are located consecutively in one block.

14. The memory system according to claim 12, wherein any two cell units among the cell units in which respective data of the plurality of write commands are to be written, are not adjacent along a bit line direction in one block.

15. The memory system according to claim 12, wherein the cell units in which respective data of the plurality of write commands are to be written, are each located in a different block.

16. The memory system according to claim 12, wherein the cell units in which respective data of the plurality of write commands are to be written, are each located in a different string unit.

17. The memory system according to claim 16, wherein the different string units containing the cell units in which respective data of the write commands are to be written, share a word line.

18. The memory system according to claim 16, wherein the cell units of the different string units in which respective data of the write commands are to be written, are connected to different word lines.

19. A memory system comprising:

a nonvolatile memory that includes a plurality of blocks, including a first block and a second block; and a controller that controls the nonvolatile memory, wherein the controller, in response to a shutdown event, transmits a first command to the nonvolatile memory to write data into the first block, and in response to a power restore event that follows the shutdown event, transmits a second command to the nonvolatile memory to relocate the data written into the first block to the second block, and wherein during the relocating, the controller transmits a third command to the nonvolatile memory to set a read pass voltage to a first read pass voltage and, after the relocating, the controller transmits a fourth command to the nonvolatile memory to set the read pass voltage to a second read pass voltage that is lower than the first read pass voltage.

\* \* \* \* \*